(12) United States Patent
Janesick

(10) Patent No.: US 8,592,245 B2
(45) Date of Patent: Nov. 26, 2013

(54) SUBSTRATE BIAS FOR CMOS IMAGERS

(71) Applicant: SRI International, Menlo Park, CA (US)

(72) Inventor: James Robert Janesick, Huntington Beach, CA (US)

(73) Assignee: SRI International, Menlo Park, CA (US)

(*) Notice: Subject to any disclaimer, the term of this patent is extended or adjusted under 35 U.S.C. 154(b) by 0 days.

(21) Appl. No.: 13/654,219

(22) Filed: Oct. 17, 2012

(65) Prior Publication Data

US 2013/0040417 A1 Feb. 14, 2013

Related U.S. Application Data

(62) Division of application No. 12/844,054, filed on Jul. 27, 2010, now Pat. No. 8,319,262.

(60) Provisional application No. 61/230,440, filed on Jul. 31, 2009, provisional application No. 61/358,921, filed on Jun. 27, 2010.

(51) Int. Cl.
  *H01L 21/00* (2006.01)
(52) U.S. Cl.
  USPC .................. 438/73; 257/292; 257/E31.119
(58) Field of Classification Search
  USPC .......................................... 257/292; 438/73
  See application file for complete search history.

(56) References Cited

U.S. PATENT DOCUMENTS

| | | | |
|---|---|---|---|
| 6,040,592 A | 3/2000 | McDaniel et al. | |
| 6,259,085 B1 | 7/2001 | Holland | |
| 6,586,789 B1 | 7/2003 | Zhao | |
| 6,858,912 B2 | 2/2005 | Marshall et al. | |
| 7,238,583 B2 | 7/2007 | Swain et al. | |
| 2004/0065911 A1 | 4/2004 | Lixin | |
| 2005/0139833 A1 | 6/2005 | Janesick et al. | |
| 2005/0255625 A1* | 11/2005 | Janesick et al. | 438/57 |
| 2006/0226339 A1 | 10/2006 | Roh et al. | |
| 2006/0240601 A1 | 10/2006 | Nagaraja | |
| 2007/0023804 A1 | 2/2007 | Patrick | |
| 2007/0246745 A1 | 10/2007 | Min | |
| 2008/0283885 A1 | 11/2008 | Hynecek | |
| 2009/0045321 A1 | 2/2009 | Bae et al. | |
| 2009/0108311 A1 | 4/2009 | Liu | |
| 2011/0019045 A1 | 1/2011 | Lin | |

OTHER PUBLICATIONS

J. Janesick, J. Cheng, J. Bishop, J. Andrews, J. Tower, J. Walker, Mr. Grygon, and T. Elliott, "CMOS minimal array", Proc. SPIE 6295, (2006).

(Continued)

*Primary Examiner* — A. Sefer

(74) *Attorney, Agent, or Firm* — Marger Johnson & McCollom PC

(57) ABSTRACT

A CMOS image sensor is disclosed. The CMOS imager includes a lightly doped semiconductor substrate of a first conductivity type. At least one CMOS pixel of a second conductivity type is formed in the semiconductor substrate. The semiconductor substrate is configured to receive a bias voltage applied for substantially depleting the semiconductor substrate and for forming a depletion edge within the semiconductor substrate. A well of the second conductivity type substantially surrounds the at least one CMOS pixel to form a depletion region about the at least one CMOS pixel operable to form a minimum predetermined barrier to the depletion edge within the semiconductor substrate to pinch off substrate bias in proximity to the return contact.

16 Claims, 22 Drawing Sheets

(56) References Cited

OTHER PUBLICATIONS

J. Janesick, J. Andrews, J. Tower, M. Grygon, T. Elliott, J.Cheng, Mr. Lesser and J. Pinter, Fundamental performance differences between CMOS and CCD imagers; Part II, "Focal Plane Arrays for Space Telescopes III," Aug. 2007 in San Diego, paper # 6690-2.

J. Janesick, J. Andrews and T. Elliott, Fundamental performance differences between CMOS and CCD imagers; Part I, SPIE Astronomical Telescopes and Instrumentation Symposium "High Energy, Optical, and Infrared Detectors for Astronomy II," May 24-31, 2006 in Orlando, FL. paper #6276-77.

Stephen E. Holland, Donald E. Groom, Nick P. Palaio, Richard J. Stover and Mingzhi Wei, "Fully-Depleted, Back-Illuminated Charge-Coupled Devices Fabricated on High-Resistivity Silicon," IEEE Transactions of Electron Devices, vol. 50, No. 1, 225-338, Jan. 2003.

Sinyang Wang, Martin F. Snoeij, Padmakumar R. Rao, Adri Mierop and Albert J.P. Theuwissen, "A CMOS Image Sensor with a Buried-Channel Source Follower," ISCC 2008—Session 2—Imagers and Senors Technology 210.

A. Asenov, R. Balasubramaniam, A.R. Brown and J.H. Davies, "RTS amplitudes in decananometers MOSFET's: A 3D simulation study", IEEE Trans. Electron Dev., vol. 50, pp. 839-845, 2003.

* cited by examiner

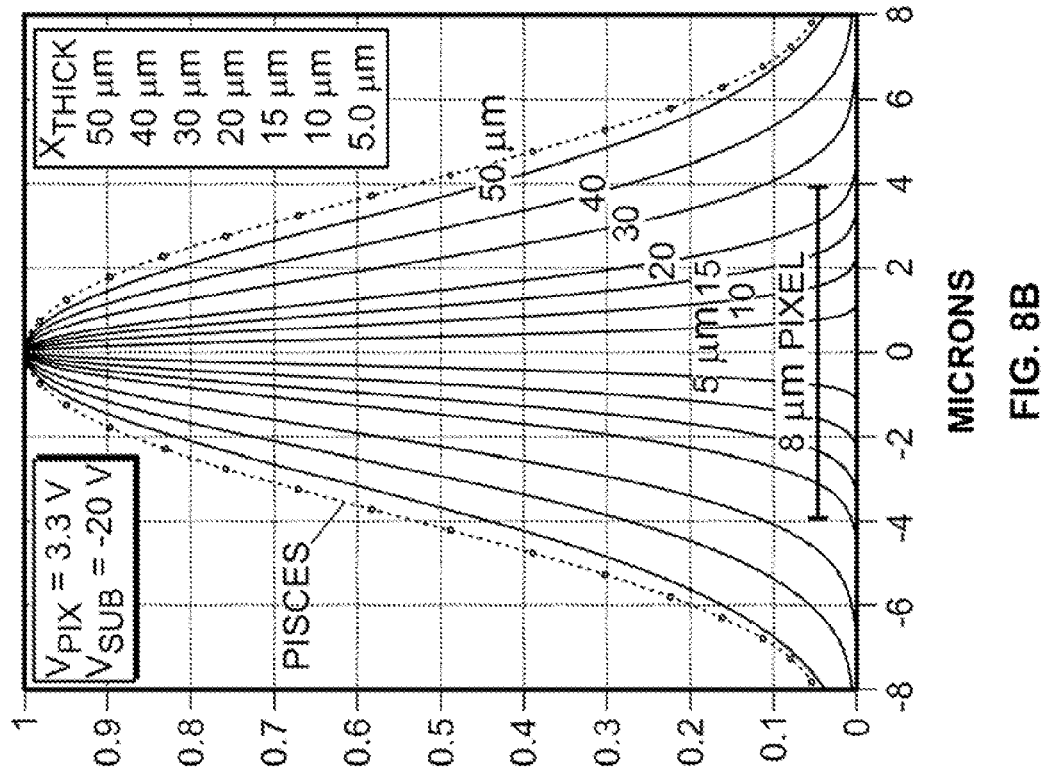
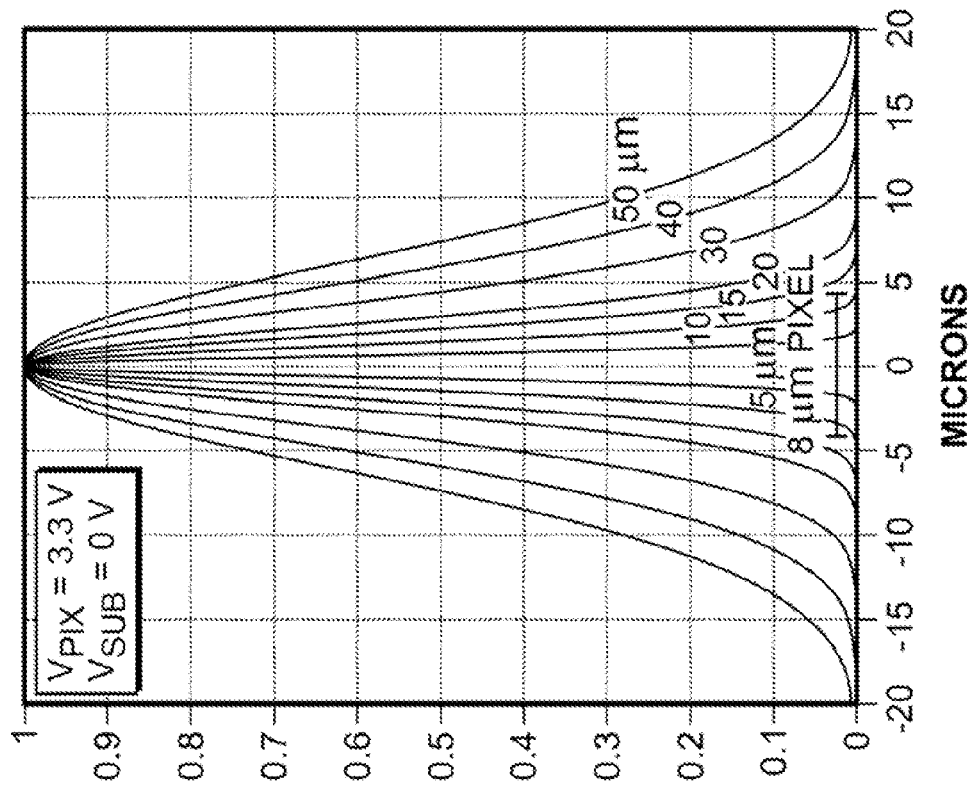
FIG. 8B
FIG. 8A

SUBSTRATE BIAS FOR CMOS IMAGERS

CROSS-REFERENCE TO RELATED APPLICATIONS

This application is a divisional of, and claims priority to U.S. patent application Ser. No. 12/844,054 filed Jul. 27, 2010, now allowed, which application claims the benefit of U.S. Provisional Patent Application No. 61/230,440 filed Jul. 31, 2009 and U.S. Provisional Patent Application No. 61/358,921 filed Jun. 27, 2010, all of which are incorporated herein by reference in their entirety for all intents and purposes.

FIELD OF THE INVENTION

The invention relates generally to imaging devices. More specifically, the invention relates to improving the performance of CMOS imagers by exploiting substrate bias techniques.

BACKGROUND OF THE INVENTION

Generally, an image sensor is a semiconductor device for converting an optical image into an electric signal. There are a number of different types of semiconductor-based imagers, including charge coupled devices (CCDs), photodiode arrays, charge injection devices, hybrid focal plane arrays, etc. The various types of image sensors may be broadly categorized as charge coupled devices (CCD) and complementary metal oxide semiconductor (CMOS) image sensors.

CCDs are often employed for image acquisition and enjoy a number of advantages which makes it attractive for many small size imaging applications. CCDs are also produced in large formats with small pixel size and they employ low noise charge domain processing techniques.

However, CCD imagers suffer from a number of disadvantages. For example, CCDs are susceptible to radiation damage; CCDs are often expensive to manufacture; CCDs require good light shielding to avoid image smear and; CCDs have a high power dissipation for large arrays. CCD imagers also have a complicated driving method and a complicated fabrication process requiring a multi-phased photo process. A control circuit, a signal processing circuit, an analog to digital (A/D) converter circuit, etc., cannot be easily integrated into a CCD chip, thereby inhibiting the use of CCDs in compact size products. While there have been some attempts to integrate on-chip signal processing with a CCD array, these attempts have not been entirely successful. CCDs also must transfer an image by linear charge transfers from pixel to pixel, requiring that the entire CCD array be read out into a memory before individual pixels or groups of pixels may be accessed and processed. This takes time. CCDs may also suffer from incomplete charge transfer from pixel to pixel during charge transfer which also results in image smear.

Because of the inherent limitations in CCD technology, there has been increased interest in CMOS imagers for possible use as low cost imaging devices. CMOS image sensors first came to the fore in relatively low-performance applications where shuttering was not required, scene dynamic range was low, and moderate to high noise levels could be tolerated. A CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, star trackers, motion detection systems, image stabilization systems and high-definition television imaging devices.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCDs since standard CMOS processing techniques may be used. Additionally, CMOS imagers exhibit low power consumption because only one row of pixels at a time needs to be active during readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

FIGS. 1A and 1B are cross-sectional views of conventional CMOS pixels known as 3T pixels (for three-transistor pixel) and 5T pixels (for 3-transistor plus 2-transfer gate pixel). More precisely, the 3T pixel 10 of FIG. 1A (designated hereinafter an n__3TPPD pixel) includes three NMOS transistors 12, 14, 16 standing for a reset transistor 12, a source follower transistor 14 and a row transistor 16. The reset transistor 12 is electrically connected to a sense node 18. The sense node 18 is formed of an n+ contact 22 and a pinned photodiode 20. The pinned photodiode 20 includes a thin p-type pinning layer 26 overlying a custom n-diode implant 24, that in turn, overlies and forms a depletion region with a p-epitaxial layer 30. A p-substrate 32 underlies the p-epitaxial layer 30. A p-well 34 is formed adjacent the pinned photodiode 20 in the p-epitaxial layer 30 for isolating the n__3TPPD pixel 10 from neighboring pixels. A p+ return contact 36 is formed proximal to the other side of the pinned photodiode 20 and is held at ground potential (about 0V) for providing a return and ground reference for the n__3TPPD pixel. A p-well 38 is formed adjacent to the p+ return contact 36.

When operated, a CLOCK applied to the gate of the reset transistor 12 causes a reverse bias on the pinned photodiode 20. The source follower transistor 14 and the row transistor 16 are coupled between a drain supply $V_{DD}$ of about 3.3V and an output signal terminal COLUMN VIDEO. The drain of the reset transistor 12 is connected to $V_{DD}$; the gate of the reset transistor 12 is connected to a RESET clock; and the source of the reset transistor is connected to the cathode of the pinned photodiode 20 so that the reset transistor 12 operates as a source follower. The source of the source follower transistor 14 is connected to the drain of the row transistor 16, and the source of the row transistor 16 is connected to output terminal COLUMN VIDEO. In applications, a plurality of such 3T pixels is coupled to the same output terminal COLUMN VIDEO. By selectively applying row address signal ROW SELECT to the gate of the selected row transistor 16, different rows may be coupled to the output terminal COLUMN VIDEO (i.e., a column bus).

The 5T pixel 40 (FIG. 1B), also known as a charge transfer pixel (designated hereinafter an n__5TPPD pixel), is similar to the 3T pixel 10 (FIG. 1A) except that the 5T pixel 40 has a transfer gate 42 coupled between the reset transistor 12 and the pinned photodiode 20 so that a sense node 44 may be created between the transfer gate 42 and the reset transistor 12. The sense node 44 may be isolated from the pinned photodiode 20. As a result, charge may be transferred from a photodetection region to the sense node 44 when a positive voltage (preferably a "logical 1" or "high" positive voltage of about 3.3V) is applied to the input TRANSFER GATE 1, where a resulting voltage is read out by the source follower transistor 14.

The 5T pixel 40 also includes a second transfer gate 46 abutting the side of the pinned photodiode 20 distal to the transfer gate 42. An n+ contact 48 is formed adjacent to the second transfer gate 44 distal to the pinned photodiode 20 and is also tied to $V_{REF}$ (about +3.3 volts). The second transfer gate 44 may be used as a global reset for the imager and as an antiblooming gate for preventing excess charge generated in the photodiode 20 from "blooming" through the transfer gate 42 to the sense node 44 when a voltage is applied to the input TRANSFER GATE 2 that is more positive than the transfer gate-to-sense node voltage.

Similar 4T and 6T CMOS pixel designs are also known. The n_3TPPD and n_5TPPD and similar n_4TPPD and n_6TPPD pixels are hereinafter designated as n_pixels.

High performance for both CCD and CMOS imagers implies at least very low read noise (1-4 e−), high quantum efficiency (transmission limited), deep depletion for near IR and soft x-ray charge collection efficiency (CCE) performance, low pixel cross talk (high MTF), high charge transfer efficiency (CTE), high signal-to-noise ratio for low contrast scenes and very high speed/low noise parallel readout using integrated designs.

In a CCD imager, the electronic circuitry and gates are formed on one side of a silicon wafer, i.e., the front side; the other side of the wafer is the back side. When a CCD imager is illuminated on the front side, absorption of incident light by the electronic circuitry reduces quantum efficiency. As an alternative, CCDs may be illuminated from the back side; however, back side illumination produces other problems. When incident photons enter the back side of the CCD imager, they are absorbed in a silicon substrate and produce electronic charge by the photoelectric effect. Wafer thickness of the CCD imager must be sufficient to allow charge generation, and a depletion region should exist to transport the charge to collecting channels. For conventional low resistivity substrates, the thickness of the depletion region is limited to less than about 5 µm. Therefore, for good blue and ultraviolet response, the substrate must be extremely thin in order to have acceptable charge spreading (crosstalk), resulting in a very fragile and expensive structure.

Therefore, it is desirable to implement a back side illuminated CCD imager that has a thick substrate, and which has a high quantum efficiency over a broad range of wavelengths, from infrared and red to blue and ultraviolet.

U.S. Pat. No. 6,259,085 (hereinafter "the '085 patent") discloses a back side illuminated CCD imager formed of a relatively thick high resistivity photon sensitive silicon substrate, with frontside electronic circuitry, and an optically transparent back side ohmic contact for applying a back side voltage which is at least sufficient to substantially fully deplete the substrate. A bias voltage which overdepletes the substrate may also be applied. One way of applying the bias voltage to the substrate is by physically connecting the voltage source to the ohmic contact. An alternate way of applying the bias voltage to the substrate is to physically connect the voltage source to the front side of the substrate at a point outside the depletion region. Thus both front side and back side contacts may be used for back side biasing to fully deplete the substrate.

Compared to CCDs, low pixel cross talk is more difficult to achieve for the CMOS imagers described in the '085 patent, especially for thick imagers that detect near IR and x-ray photons. For these sensors, high resistivity epitaxial silicon is also required for deep depletion and good charge collection efficiency (CCE). However, even when silicon is fully depleted, the desired low cross talk may not be realized. Hence, as with CCD imagers, it is desirable to apply an additional bias voltage across the imager in the form of substrate bias to deal with the cross talk problem (other than just employing high substrate resistivity). Following how very deep depletion CCDs handled the CCE problem as described in the '085 patent, substrate bias may also significantly improve cross talk performance for CMOS imagers. However, the technique is considerably more difficult to implement in CMOS compared to CCDs.

Accordingly, what would be desirable, but has not yet been provided, is a fully implemented CMOS imager that effectively employs substrate bias to reduce or eliminate cross talk.

SUMMARY OF THE INVENTION

The above-described problems are addressed and a technical solution achieved in the art by providing a CMOS image sensor, comprising a lightly doped semiconductor substrate of a first conductivity type; and at least one CMOS pixel of a second conductivity type formed substantially in the semiconductor substrate; wherein the semiconductor substrate is configured to receive a bias voltage applied for substantially depleting the semiconductor substrate and for forming a depletion edge substantially within the semiconductor substrate.

According to an embodiment of the present invention, the at least one CMOS pixel further comprises: a highly doped sense node of the second conductivity type; a reset transistor of the second conductivity type in signal communication with the sense node; a source follower transistor of the second conductivity type in signal communication with the sense node; a row select transistor of the second conductivity type in signal communication with the source follower transistor; and a highly doped return contact of the first conductivity type configured to receive a return potential for providing a return reference for the reset transistor, the source follower transistor, and the row select transistor. A photodiode is formed in the semiconductor substrate in signal communication with the sense node. A well of the second conductivity type substantially surrounds the at least one CMOS pixel to form a depletion region about the at least one CMOS pixel operable to form a minimum predetermined barrier to the depletion edge within the semiconductor substrate to pinch off substrate bias in proximity to the return contact. The minimum predetermined barrier voltage has a magnitude of at least 10 kT, wherein k is the Boltzmann constant and T is temperature in degrees Kelvin. The minimum predetermined barrier is based on minimizing the area covered by the return contact.

According to an embodiment of the present invention, the CMOS image sensor further comprises driver logic formed in the semiconductor substrate. The driver logic is at least one of an address encoder, a pixel bipolar driver, and a multiplexor. At least one well of the first conductivity type is formed adjacent to and substantially underlying the driver logic operable to receive a bias for the driver logic.

According to an embodiment of the present invention, the resistivity of the semiconductor substrate is at least 100 ohms-cm, preferably about 10,000 ohms-cm.

According to an embodiment of the present invention, the at least one CMOS pixel further comprises a first charge transfer gate located between the sense node and the phototransistor. A second charge transfer gate located adjacent the phototransistor and distal to the first transfer gate and a highly doped contact of the first conductivity type is formed in the semiconductor substrate and configured for receiving a potential for providing a global reset of the at least one pixel and for preventing charge carriers from blooming to the sense node.

According to another embodiment of the present invention, the step of providing a substantially high resistivity semiconductor substrate may further comprise the steps of: providing a silicon-on-insulator substrate including a mechanical substrate, an layer substantially overlying the mechanical substrate, and a semiconductor seed layer substantially overlying the insulator layer; epitaxially growing the semiconductor substrate overlying the seed layer; an removing the mechanical substrate and at least a portion of the insulator layer. An ultrathin oxide layer may be formed substantially underlying the semiconductor substrate and a mono layer of metal may be formed substantially underlying the ultrathin oxide layer. The ultrathin oxide layer may be formed by a chemisorption process.

According to another embodiment of the present invention, a "ring pixel" is formed of a highly doped sense node of a first conductivity type in a semiconductor substrate of a second conductivity type and positioned substantially in the center of the "ring pixel." A transfer gate formed about the sense node. At least one photodiode is formed about the transfer gate. A reset transistor, a source follower transistor, and a row select transistor are located substantially to one side of the "ring pixel" substantially adjacent to the photodiode. An optional implant may be formed about the photodiode operable to step potential in a direction toward the sense node.

A method for forming a CMOS image sensor is also disclosed, comprising the steps of: providing a lightly doped substantially high resistivity semiconductor substrate of a first conductivity type; forming at least one CMOS pixel of a second conductivity type formed in the semiconductor substrate; and applying a bias voltage to the semiconductor substrate for substantially depleting the semiconductor substrate of charge carriers and for forming a depletion edge within the semiconductor substrate. The at least one CMOS pixel further comprises: a highly doped sense node of the second conductivity type; a reset transistor of the second conductivity type in signal communication with the sense node; a source follower transistor of the second conductivity type in signal communication with the sense node; a row select transistor of the second conductivity type in signal communication with the source follower transistor; and a highly doped return contact of the first conductivity type configured to receive a return potential for providing a return reference for the reset transistor, the source follower transistor, and the row select transistor.

According to an embodiment of the present invention, the method may further comprise the step of forming a well of the second conductivity type substantially surrounding the at least one CMOS pixel to form a depletion region about the at least one CMOS pixel operable to form a minimum predetermined barrier to the depletion edge within the semiconductor substrate to pinch off substrate bias in proximity to the return contact. The method may further comprise the step of forming driver logic in the semiconductor substrate. The method may further comprise the step of forming at least one well of the first conductivity type adjacent to and substantially underlying the driver logic operable to receive a bias for the driver logic.

According to another embodiment of the present invention, a "ring pixel" may be formed comprises the steps of: forming a highly doped sense node of the second conductivity type in the semiconductor substrate; forming a transfer gate about the sense node; and forming at least one photodiode about the transfer gate; wherein the sense node is formed substantially in the center of the ring pixel.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which:

FIGS. 8A and 8B plot 'point-spread' responses for the same thicknesses as FIG. 7B with and without −20 V substrate bias applied, respectively;

It is to be understood that the attached drawings are for purposes of illustrating the concepts of the invention and may not be to scale.

DETAILED DESCRIPTION OF THE INVENTION

Figure 1A:
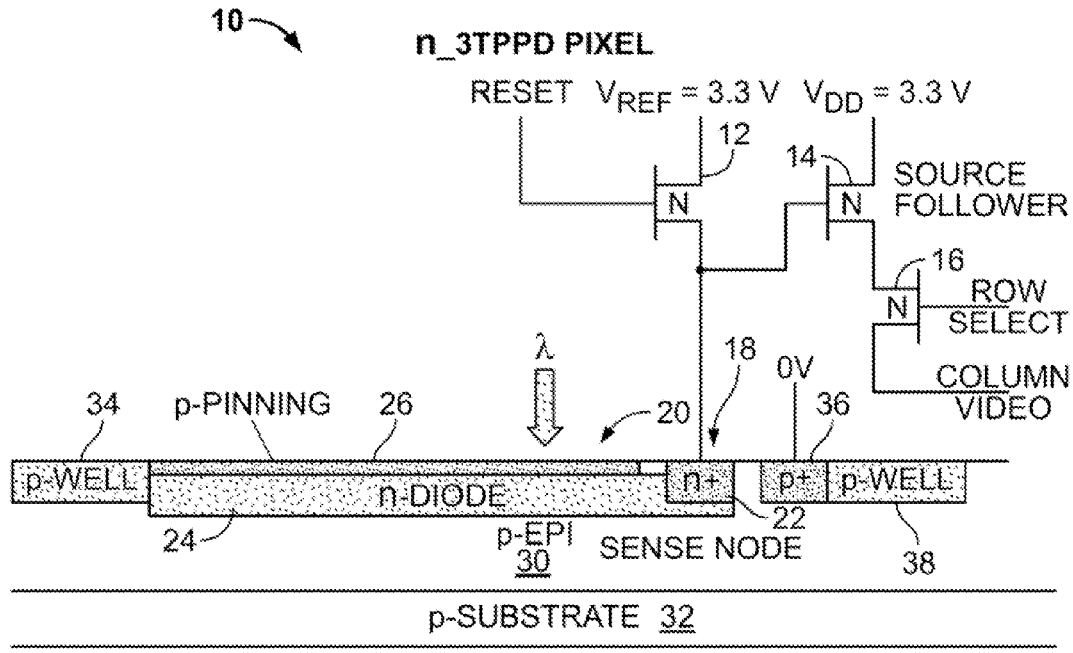
FIGS. 1A and 1B are cross-sectional views of conventional CMOS pixels known as 3T pixels (for three-transistor pixel) and 5T pixels (for 3-transistor plus 2-transfer gate pixel. respectively.
Figure 1B:
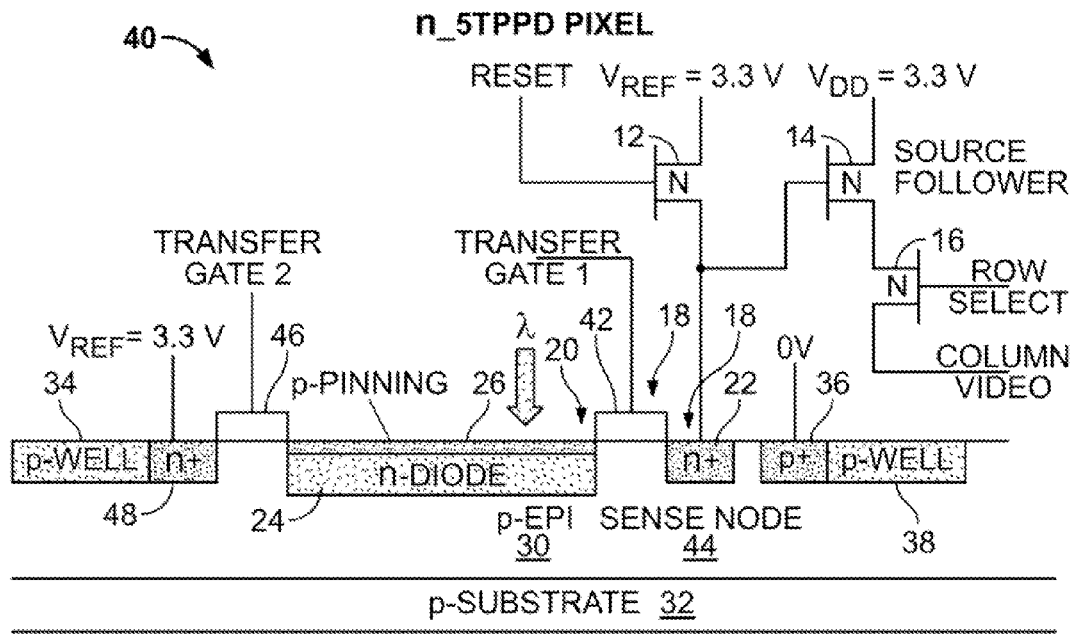
Figure 2A:
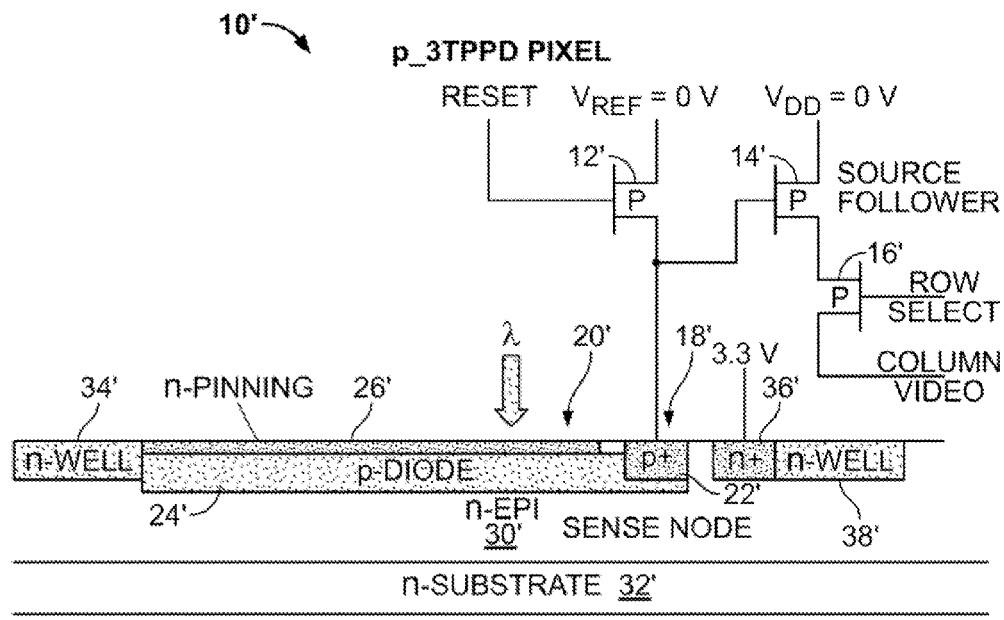
FIGS. 2A and 2B are cross-sectional views of CMOS pixels having substantially corresponding structures to the pixels of FIGS. 1A and 1B with doping conductivity types reversed, according to an embodiment of the present invention.
Figure 2B:
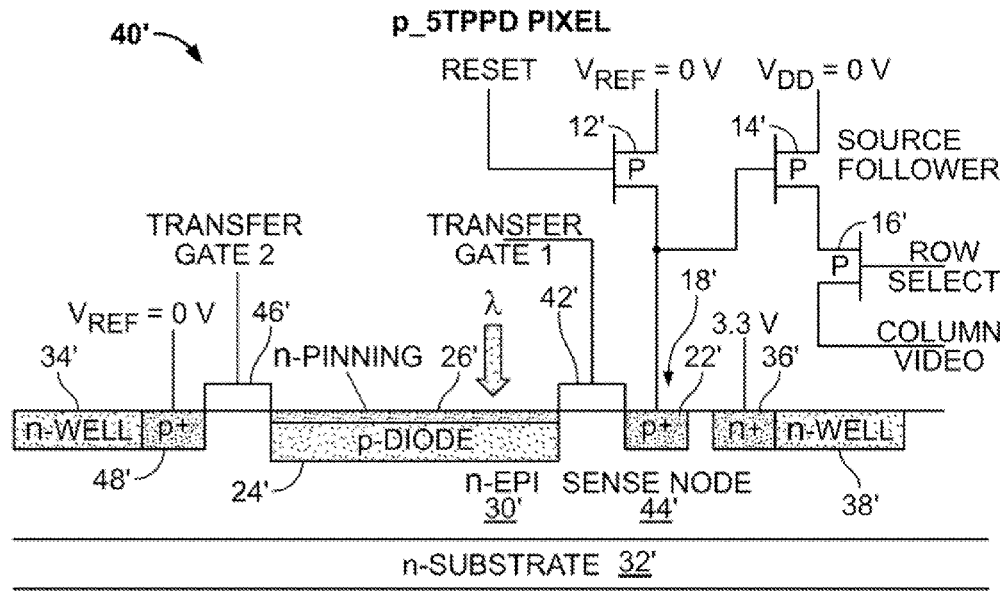

FIGS. 2A and 2B are cross-sectional views of CMOS pixels having substantially corresponding structures to the pixels of FIGS. 1A and 1B with doping conductivity types reversed, according to an embodiment of the present invention. The CMOS pixels are hereinafter designated as p__3TPPD and p__5TPPD pixels, 10', 40', respectively. The p__3TPPD pixel 10' includes three PMOS transistors 12', 14', 16' standing for a reset transistor 12', a source follower transistor 14' and a row transistor 16'. The reset transistor 12' is electrically connected to a sense node 18'. The sense node 18' is formed of a p+ contact 22' and a pinned photodiode 20'. The pinned photodiode 20' includes a thin n-type pinning layer 26' overlying a custom p-diode implant 24', that in turn, overlies and forms a depletion region with an n-epitaxial layer 30'. An n-substrate 32' underlies the n-epitaxial layer 30'. An n-well 34' is formed adjacent the pinned photodiode 20' in the n-epitaxial layer 30' for isolating the p__3TPPD pixel 10' from neighboring pixels. An n+ return contact 36' is formed proximal to the other side of the pinned photodiode 20' and is held at "high" potential (about +3.3V) for providing a return and reference for the p__3TPPD pixel. An n-well 38' is formed adjacent to the p+ return contact 36'.

When operated, a RESET CLOCK (about 0 V) applied to the gate of the reset transistor 12' causes a reverse bias on the pinned photodiode 20'. The source follower transistor 14' and the row transistor 16 are coupled between a drain supply $V_{DD}$ of about 0V and an output signal terminal COLUMN VIDEO. The drain of the reset transistor 12' is connected to $V_{DD}$; the gate of the reset transistor 12' is connected to a RESET clock; and the source of the reset transistor 12' is connected to the anode of the pinned photodiode 20' so that the reset transistor 12' operates as a source follower. The source of the source follower transistor 14' is connected to the drain of the row transistor 16', and the source of the row transistor 16' is connected to output terminal COLUMN VIDEO. In applications, a plurality of such 3T pixels is coupled to the same output terminal COLUMN VIDEO. By selectively applying row address signal ROW SELECT to the gate of the selected row transistor 16', different rows may be coupled to the output terminal COLUMN VIDEO (i.e., a column bus).

The 5T pixel 40' (FIG. 2B), also known as a charge transfer pixel (designated hereinafter an n__5TPPD pixel), is similar to the 3T pixel 10' (FIG. 2A) except that the 5T pixel 40' has a transfer gate 42' coupled between the reset transistor 12' and the pinned photodiode 20' so that a sense node 44' may be created between the transfer gate 42' and the reset transistor 12'. The sense node 44' may be isolated from the pinned photodiode 20'. As a result, charge may be transferred from a photodetection region to the sense node 44' when a "logical 0" or "1 w" ground potential of about 0V is applied to the input TRANSFER GATE 1, where a resulting voltage is read out by the source follower transistor 14'.

The 5T pixel 40' also includes a second transfer gate 46' abutting the side of the pinned photodiode 20' distal to the transfer gate 42'. A p+ contact 48' is formed adjacent to the second transfer gate 46' distal to the pinned photodiode 20' and is tied to $V_{REF}$ (about 0 volts). The second transfer gate 46' may be used as a global reset for the imager and as an antiblooming gate for preventing excess charge generated in the photodiode 20' from "blooming" through the transfer gate 42' to the sense node 44' when a voltage is applied to the input TRANSFER GATE 2 that is more negative than the transfer gate-to-sense node voltage.

The p__3TPPD and p__5TPPD pixels are hereinafter designated as p_pixels.

Figure 3:
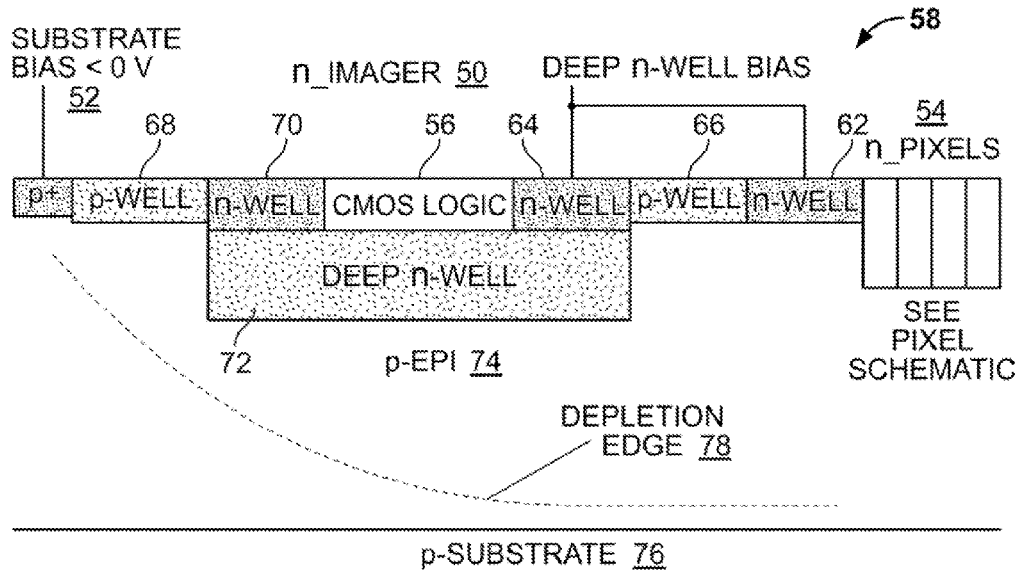
FIG. 3 is a cross-sectional view of a CMOS imager employing the pixels of FIGS. 2A and 2B and negative substrate bias, according to an embodiment of the present invention.

FIG. 3 is a cross-sectional view of a CMOS imager 50 (hereinafter designated as an n_imager 50) configured to have an applied negative (less than 0 V) substrate bias, according to an embodiment of the present invention. Referring now to FIGS. 1A, 1B, and 3, the n_imager 50, in a preferred embodiment shown, includes a substrate bias contact 52 having a p+ polarity and a plurality of n_pixels 54. The n_imager 50 includes driver logic 56 for the n_pixels 54. The CMOS driver logic 56 may include digital logic elements (e.g., address encoders, pixel bipolar drivers, multiplexers, etc.).

In a preferred embodiment, negative substrate bias may be applied to a portion of the front side 58 of the n_imager 50, such as the substrate bias contact 52, or it may be applied to the back side 60 of the n_imager 50, but in practice a frontside substrate contact (i.e., the substrate bias contact 52) is used.

The n_pixels 54 are separated from the CMOS driver logic 56 by a pair of n-wells 62, 64 abutting an intervening p-well 66. A p-well 68 separates the p+ substrate bias contact 52 and an n-well 70 abutting the CMOS driver logic 56 distal to the n-well 64. The n wells 62, 64 may have a separate DEEP n-well bias of about +3.3 volts applied. The n wells 64, 70 provide access contacts for biasing a deep n-well implant 72 to be described hereinbelow. The n well 62 closest to the n_pixels 54 surrounds the entire pixel region (not shown) to form a depletion region around the edge of the n_pixels 54 to ensure that the n_pixels 54 pinch off substrate bias in proximity to the p+ return contact 36 to be described hereinbelow.

The substrate bias contact 52, the n_pixels 54, and the wells 62-72 may be formed in an p-type epitaxial layer 74, preferably made of silicon, which overlies a p-type substrate 76. The epitaxial layer 74 may have a relatively high resistivity greater than about 10,000 ohm-cm. According to an embodiment of the present invention, the resistivity of the p-type epitaxial layer 74 may preferably be greater than about 100 ohm-cm, more preferably about 10,000 ohm-cm. However, substrate bias is applicable to a p-type epitaxial layer 74 having any resistivity. To achieve substantially full depletion of the p-type epitaxial layer 74, in a preferred embodiment, the p-type epitaxial layer 74 may be composed of intrinsic silicon or lightly doped (shown as p- in FIG. 2A). Since maximum depletion depth varies as the square root of the resistivity for silicon, for a resistivity of greater than about 10,000 ohm-cm, full depletion may be achieve for a depth of the p-type epitaxial layer 74 in the range of about 300 microns (and 30 microns without substrate bias). A negative voltage is applied to the bias contact 52 to deplete the p-type epitaxial layer 74 in a depletion region extending the full p-type epitaxial layer 74 thickness below each of the n_pixels 54.

In operation, charge collects below the n_pixels 54 (not shown). As the p-type epitaxial layer 74 is depleted of majority carriers (i.e., in this case holes), there is a danger that the p+ return contact 36 may short to a substrate bias depletion edge 78 shown. To prevent shorting, a sufficient potential barrier needs to be produced between the p+ return contact 36 and the substrate bias depletion edge 78 to prevent (hole) leakage current flow. The required barrier height is primarily dependent on the positive bias potential applied to the n well 62 closest to the n_pixels 54, on the width of the p-well 38 (which varies with design rules), and on the dimensions of the p+ return contact 36.

Figure 4B:
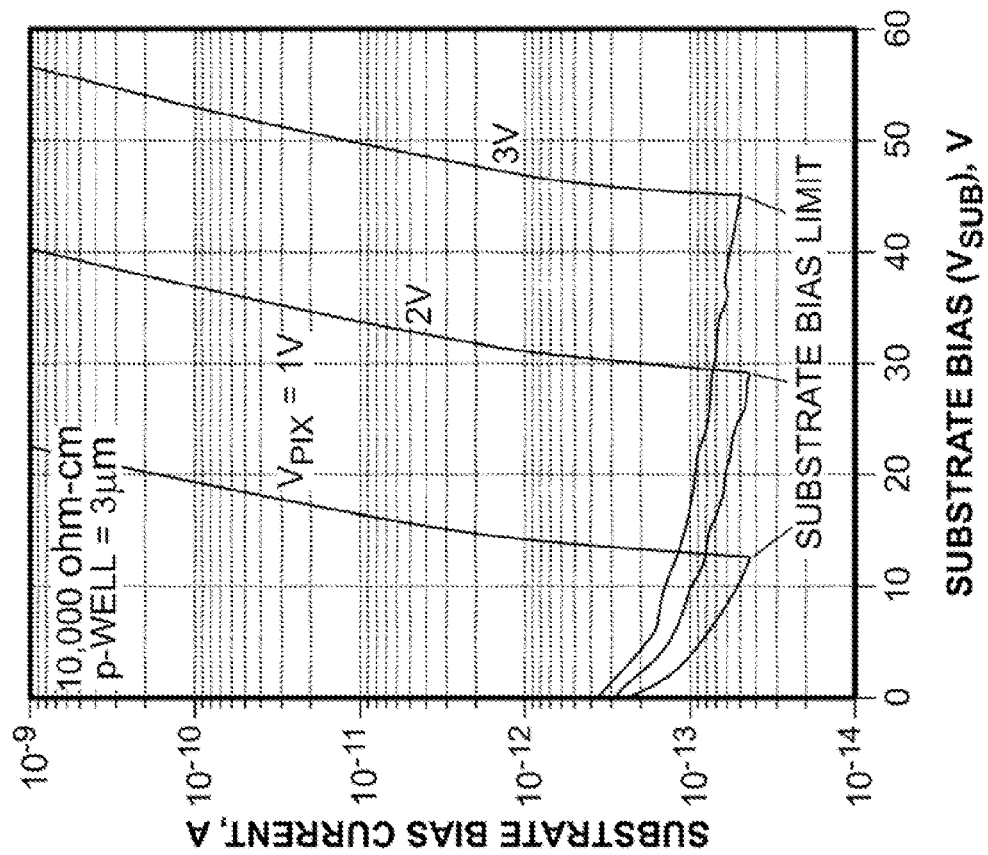
FIG. 4B plots substrate current and bias showing where a limit to the amount of substrate bias that may be applied occurs for the CMOS imager of FIG. 3.
Figure 4A:
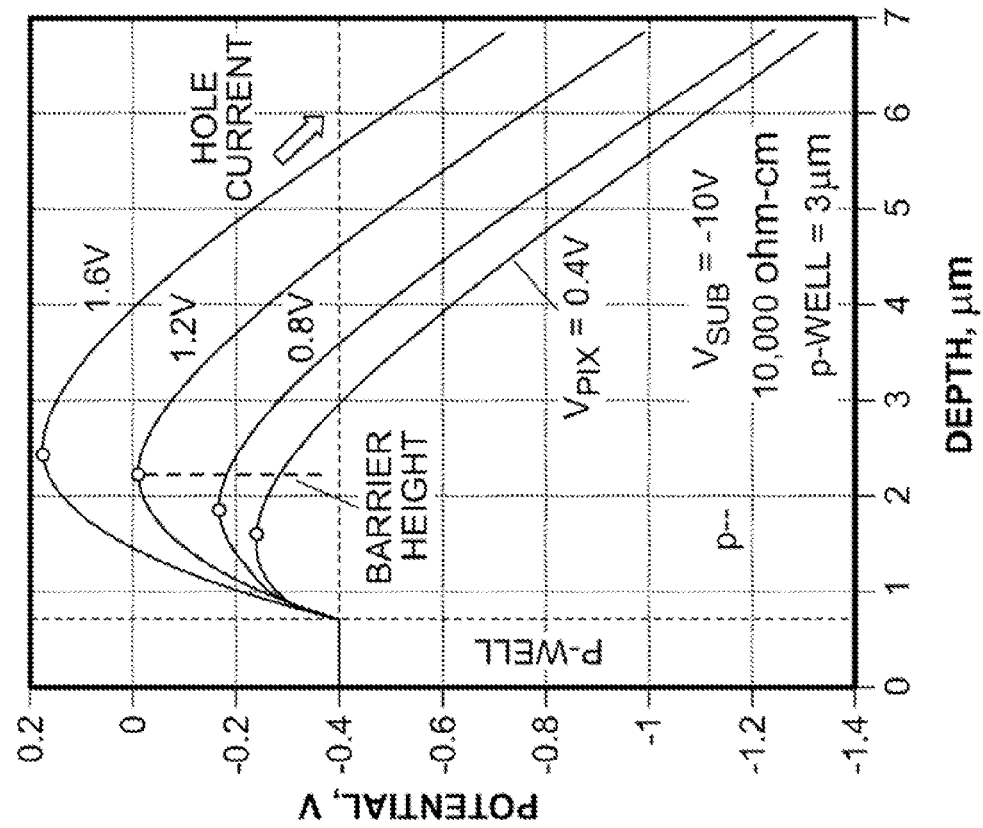
FIG. 4A is a PISCES simulation that plots potential through a p-well region as a function of device depth for the CMOS imager of FIG. 3.

FIG. 4A presents a PISCES (Poisson and Current Continuity Equation Solver)/SUPREM (Stanford University Process Modeling) simulation that plots potential through the p_pixel's p-well 38 as a function of device depth. Reverse bias across the pinned photodiode 20 is varied (0.4, 0.8, 1.2 and 1.6 V). Note as the diode bias decreases, the barrier height under the p+ return contact 36 also decreases, signifying a limit to the amount of substrate bias that may be applied. To prevent substrate bias current from flowing, at least 250 mV of barrier voltage is preferred (i.e., about 10 kT, where k is the Boltzmann constant and T is temperature in degrees Kelvin). FIG. 4B plots substrate current and bias showing where that limit occurs.

Barrier height decreases with silicon resistivity and increases with its thickness. The width of p+ return contact 36 requires minimum design rules but should not be so small in width to cause pixel-to-pixel blooming. The n_pixels 54 should have the largest active fill factor possible for maximum substrate bias.

According to an embodiment of the present invention, the amount of substrate bias that may be applied without causing pixel ground shorting varies in inverse proportion to grounding/return area that a pixel has. As a result, the area covered by each of the p+ return contacts 36 is kept to a minimum according to standard CMOS minimum line width design rules.

As seen in FIG. 3, the CMOS driver logic 56 formed in the n_imager 50 also relies on the p+ return contact 36 for operation. It is not possible to 'pinch off' this circuitry from substrate bias as is done for the n_pixels 54. Instead, a biased deep n-well implant 72 is employed under the CMOS driver logic 56 to generate a sufficient barrier for substrate bias. FIG. 3 also shows that the substrate bias contact 52 is far removed from the n_pixels 54. As it turns out, the pixel depletion region does not extend to the backside of the sensor if the depletion reaches the substrate bias contact 52 first. The minimum separation dimension between the n_pixels 54 and the substrate bias contact 52 assumes that this distance is approximately equal to the thickness of the p-type epitaxial layer 74.

Figure 5:
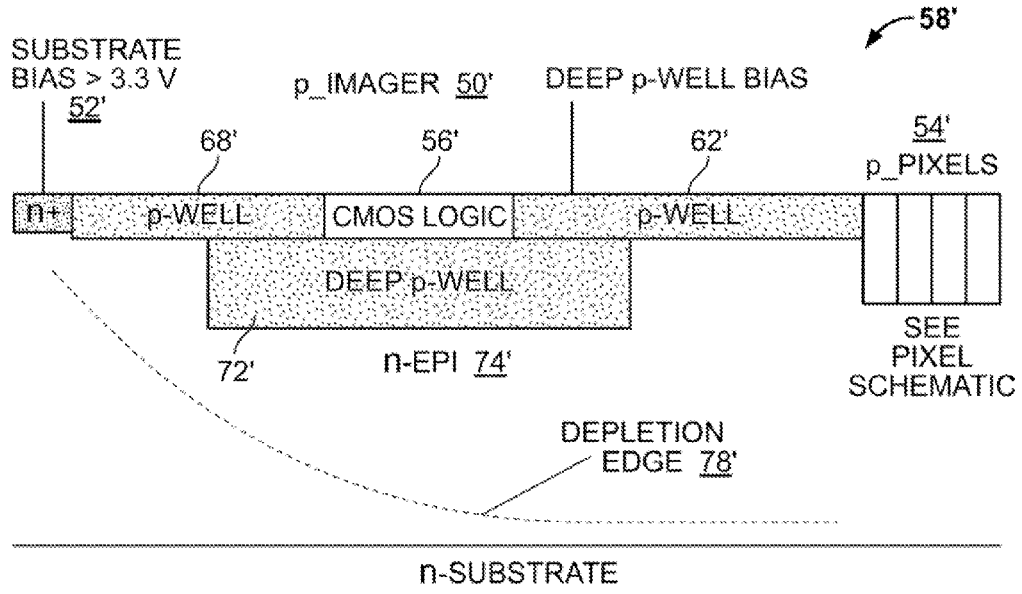
FIG. 5 is a cross-sectional view of a CMOS imager employing p_pixels and positive substrate bias, according to an embodiment of the present invention.

FIG. 5 is a cross-sectional view of a CMOS imager 50' (hereinafter designated as a p_imager 50') configured to have an applied positive (greater than about +3.3 V) substrate bias, according to an embodiment of the present invention. Referring now to FIGS. 2A, 2B, and 5, the p_imager 50', in a preferred embodiment shown, includes a substrate bias contact 52' having an n+ polarity and a plurality of p_pixels 54'.

The p_imager 50' includes driver logic 56' for the p_pixels 54'. The CMOS driver logic 56' may include digital logic elements (e.g., address encoders, pixel bipolar drivers, multiplexers, etc.).

In a preferred embodiment, positive substrate bias may be applied to a portion of the front side 58' of the p_imager 50', such as the substrate bias contact 52', or it may be applied to the back side 60' of the p_imager 50', but in practice a frontside substrate contact (i.e., the substrate bias contact 52') is used.

The p_pixels 54' are separated from the CMOS driver logic 56' by a p-well 62'. A p-well 68' separates the n+ substrate bias contact 52' from the CMOS driver logic 56' distal to the p-well 62'. The p well 62' may have a separate DEEP p-well bias of about 0 volts. The p wells 62', 68' provide access contacts for biasing a deep p-well implant 72' to be described hereinbelow. The p well 62' closest to the p_pixels 54' surrounds the entire pixel region (not shown) to form a depletion region around the edge of the p_pixels 54' to ensure that the p_pixels 54' pinch off substrate bias in proximity to the n+ return contact 36' to be described hereinbelow (The p-well 62', 68' naturally come with fabrication. A p-well is everywhere on a wafer containing at least one p_imager 50', unless another layer is intentionally implanted. An n-well is one such layer, which is only used when required. This is the difference between n and p-well. There is never a naked silicon surface, since it must be passivated. According to an embodiment of the present invention, p-well is chosen for passivation. The same p-well passivation is applied to the n_image 50 above).

The substrate bias contact 52', the p_pixels 54', and the wells 62', 68', 72' may be formed in an n-type epitaxial layer 74', preferably made of silicon, which overlies an n-type substrate 76'. The epitaxial layer 74' may have a relatively high resistivity greater than about 10,000 ohm-cm. According to an embodiment of the present invention, the resistivity of the p-type epitaxial layer 74' may preferably be greater than about 100 ohm-cm, more preferably about 10,000 ohm-cm. However, substrate bias is applicable to a p-type epitaxial layer 74' having any resistivity. To achieve substantially full depletion of the p-type epitaxial layer 74', in a preferred embodiment, the p-type epitaxial layer 74' may be composed of intrinsic silicon or lightly doped (shown as n- in FIG. 5). Since maximum depletion depth varies as the square root of the resistivity for silicon, for a resistivity of greater than about 10,000 ohm-cm, full depletion may be achieve for a depth of the n-type epitaxial layer 74' in the range of about 300 microns (and 30 microns without substrate bias). A positive voltage (greater than about 3.3V) is applied to the bias contact 52' to deplete the n-type epitaxial layer 74' in a depletion region extending the full n-type epitaxial layer 74' thickness below each of the p_pixels 54'.

In operation, charge collects below the p_pixels 54' (not shown). As the n-type epitaxial layer 74' is depleted of majority carriers (i.e., in this case electrons), there is a danger that the n+ return contact 36' may short to a substrate bias depletion edge 78' shown. To prevent shorting, a sufficient potential barrier needs to be produced between the n+ return contact 36' and the substrate bias depletion edge 78' to prevent (electron) leakage current flow. The required barrier height is primarily dependent on the negative bias potential applied to the p well 62' closest to the p_pixels 54', on the width of the n-well 38' (which varies with design rules), and on the dimensions of the n+ return contact 36'.

Figure 6B:
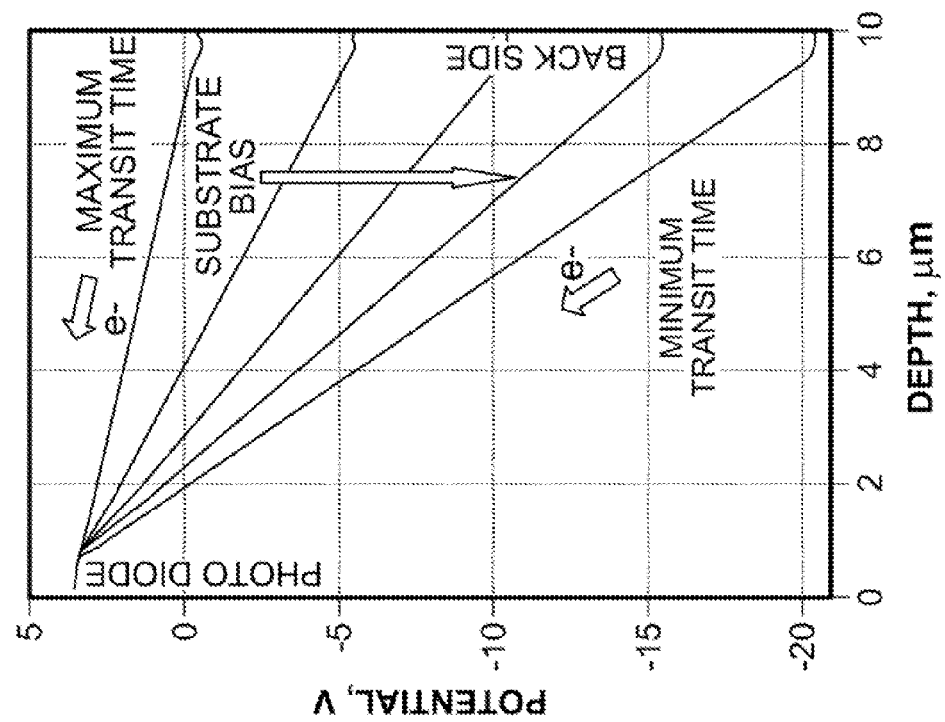
FIG. 6B plots potential with depth as substrate bias voltage changes from 0 to −20 V for the CMOS imager of FIG. 5A.
Figure 6A:
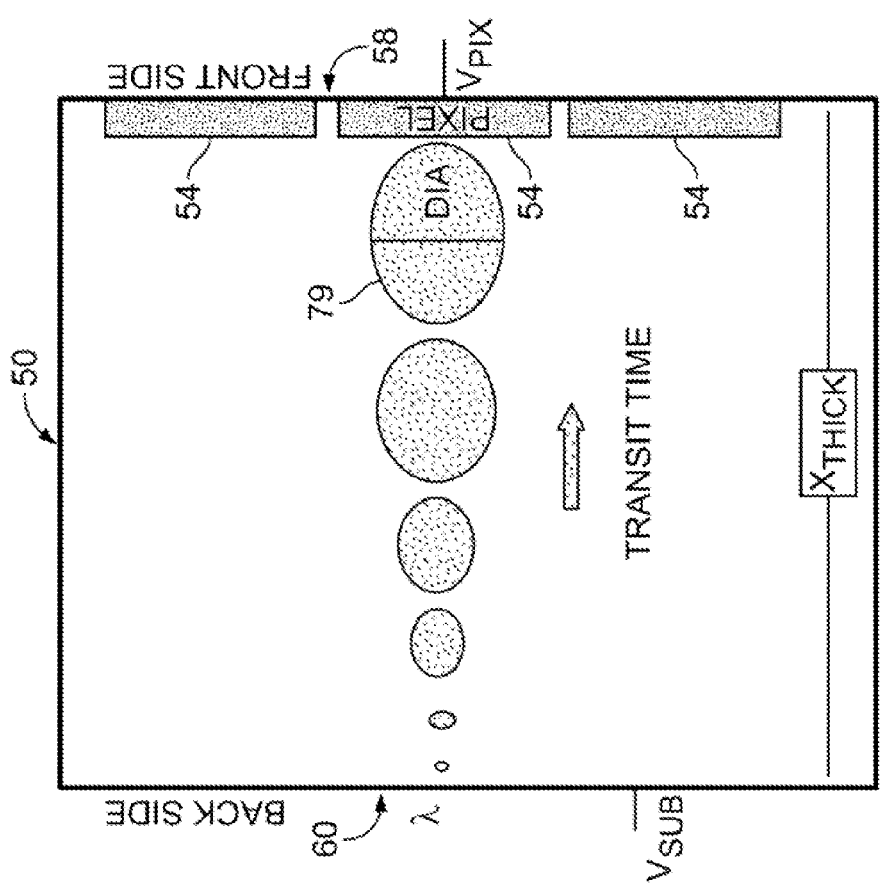
FIG. 6A cross-sectional view of the CMOS imager of FIG. 3 illustrating how a charge cloud (packet) travels from a back side of the imager to the front side by an electric field generated by a pixel and substrate bias, according to an embodiment of the present invention.

CCE improvements using substrate bias are discussed hereinbelow. FIG. 6A illustrates how a charge cloud (packet) 79 travels from a back side 60 of the n_imager 50 to the front side 58 by an electric field generated by a n_pixel 54 and substrate bias for the n_imager 50 of FIG. 3. FIG. 6B plots potential with depth as substrate bias voltage changes from 0 to −20 V for the imager 50 of FIG. 3. To achieving good CCE performance in a CMOS imager, transit time needs to be minimized in moving signal charge from the back side 50 of the n_imager 50 to the target pixel's collection region without significant diffusion among neighboring pixels. Referring again to FIG. 6B, the slopes of the curves shown represent a field strength that increases with substrate bias. During transit, thermal diffusion takes place, thereby increasing the charge cloud size, which follows a Gaussian distribution of, $$n = \left(\frac{N}{4\pi Dt}\right)^{\frac{1}{2}} \cdot e^{\left(-\frac{x^2}{4Dt}\right)} \quad (1)$$

where N is the number of electrons per unit area, D is the diffusion coefficient for high resistivity silicon (39 cm$^2$/s), x is distance about the center of the distribution (cm) and t is time (sec). For a fully depleted pixel, the resultant cloud diameter at the front side 58 of the n_imager 50 is only a function of sensor thickness and applied voltage:

$$DIA = \left[\frac{2kT}{q} \frac{x_{THICK}^2}{V_{SUB} + V_{PIX}}\right]^{\frac{1}{2}} \quad (2)$$

where $x_{THICK}$ is the sensor thickness, $V_{PIX}$ is the pixel photo diode bias, $V_{SUB}$ is the substrate voltage and kT/q is the thermal voltage (0.025 V at 300 K). The cloud diameter, DIA, is defined as ±1σ where 68.2% of the charge is contained in the cloud distribution (i.e., 2σ=2(2Dt)$^{1/2}$). The corresponding transit time is, $$tr = \frac{x_{THICK}^2}{\mu(V_{SUB} + V_{PIX})} \quad (3)$$

Where μ is the silicon mobility (1500 cm$^2$/V-s). It is important to note that the diffusion cloud size increases proportionally to sensor thickness and decreases by the square-root of applied voltage ($V_{SUB}+V_{PIX}$).

Figure 7B:
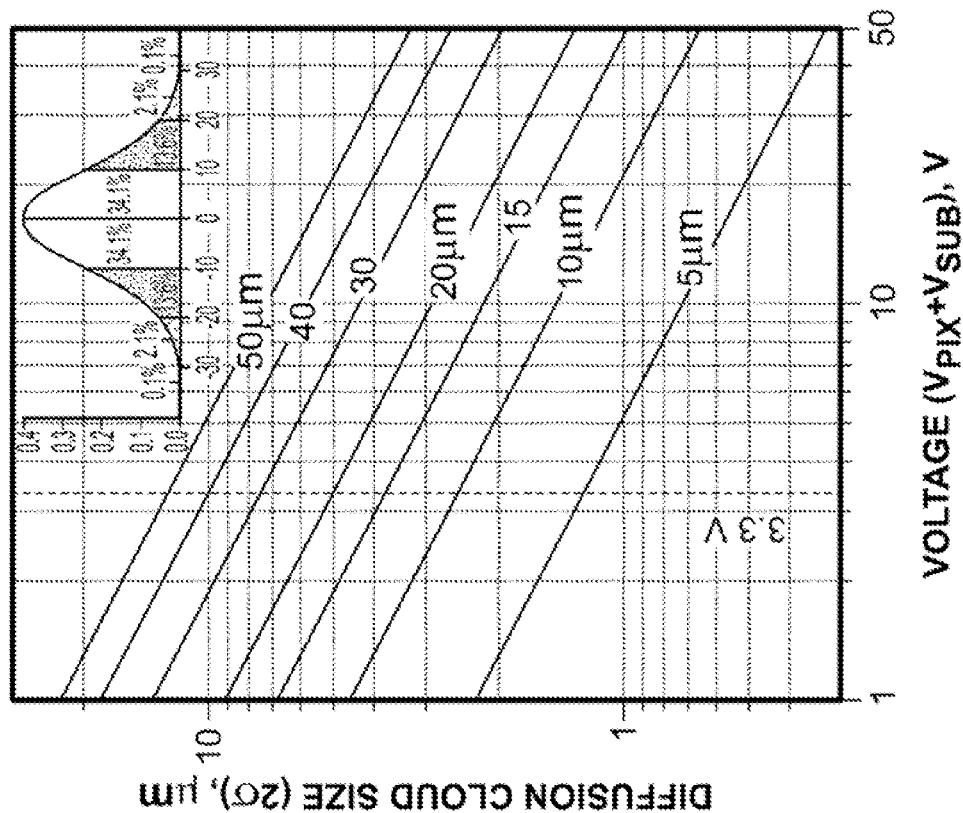
FIGS. 7A and 7B plot transit time and the resultant Gaussian as charge cloud diameter as function of applied voltage for various fully depleted epitaxial layer thicknesses, respectively, according to an embodiment of the present invention.
Figure 7A:
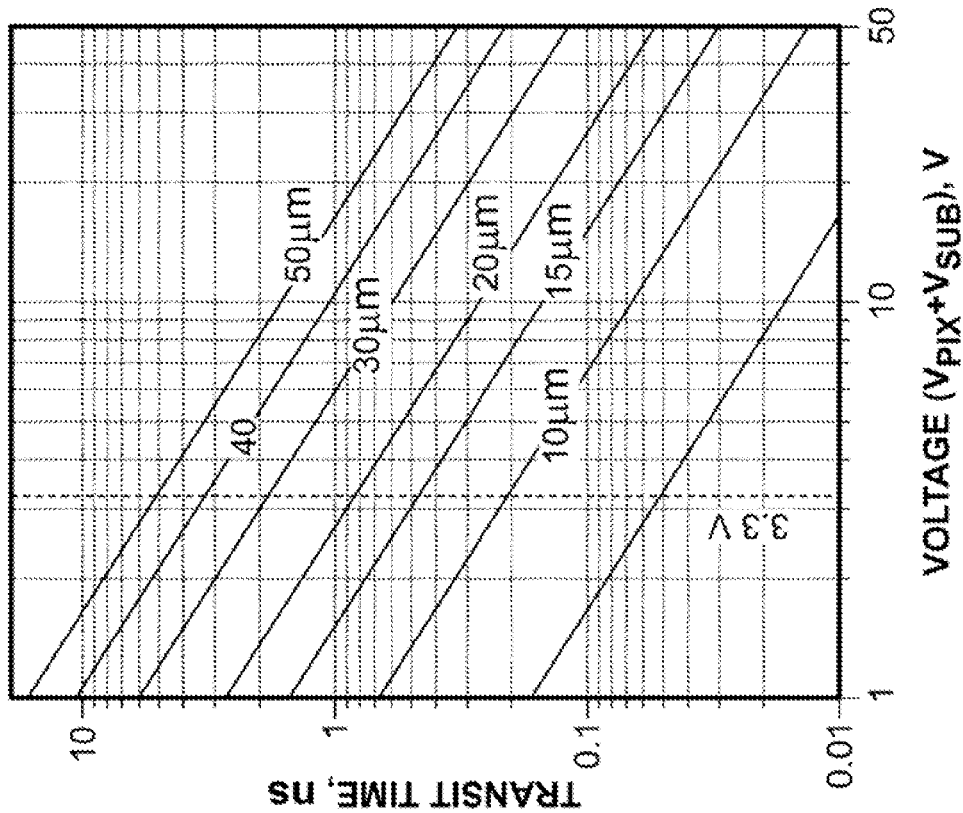

FIGS. 7A and 7B plot transit time and the resultant Gaussian 2σ charge cloud diameter as function of applied voltage for various fully depleted epi (FIG. 3) thicknesses (5, 10, 15, 20, 30, and 50 μm). Usually cross talk becomes a serious performance issue when the cloud diameter grows to be comparable to the pixel size. For example, a 30 μm thick sensor with $V_{PIX}$=3.3 V, $V_{SUB}$=0 V applied produces a 20 σcloud diameter of 7.5 μm. For a 7.5 μm pixel this diameter still leaves 32% of the signal outside the target pixel.

FIGS. 8A and 8B plot 'point-spread' responses from Eq. (1) for the same thicknesses as FIG. 7B with and without −20 V substrate bias applied ($V_{PIX}$=3.3 V), respectively. Note without substrate bias applied (FIG. 8A), the 8σ'wings' of the point-spread remain inside an 8 μm pixel for $t_{THICK}$=10 μm. With −20 V substrate bias (FIG. 8B) the thickness may be increased to 20 μm with full charge confinement. Also shown on the $V_{SUB}$=0 V plot is a PISCES simulated data point to cross check the equations above.

Figure 9:
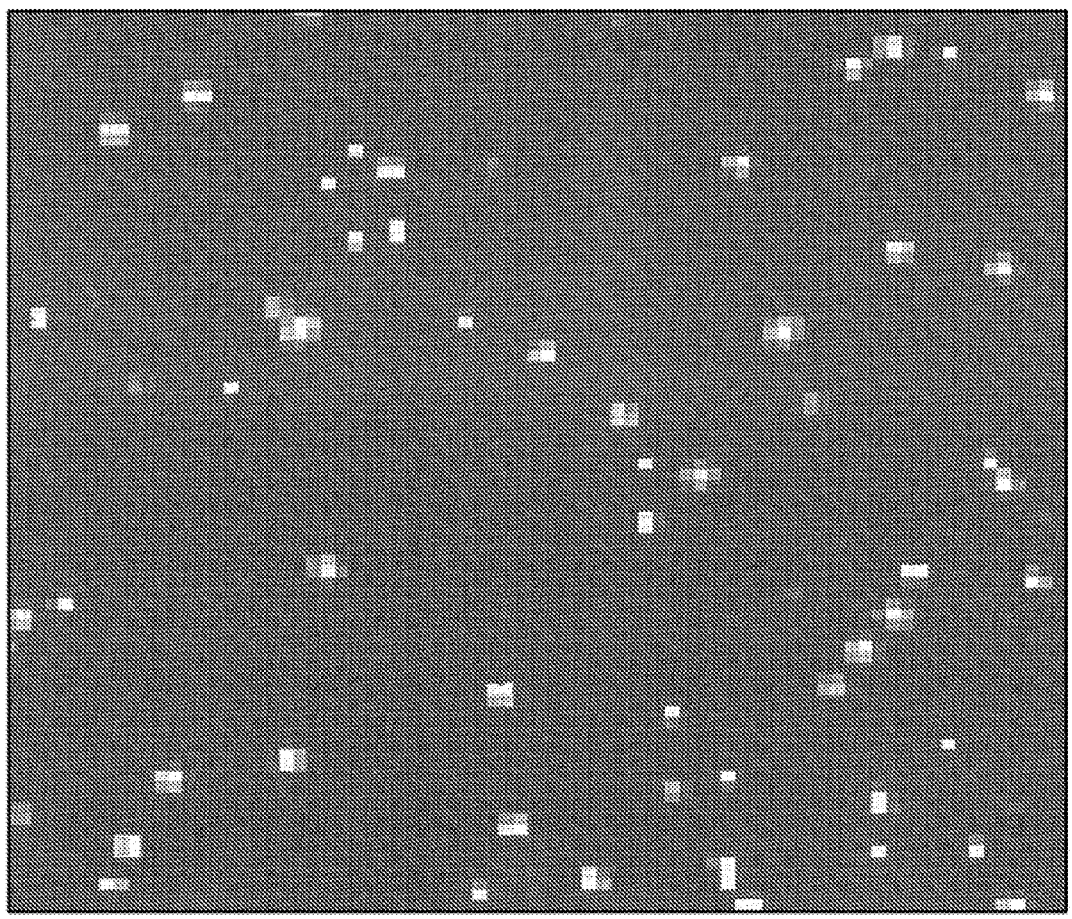
FIG. 9 is a Fe-55 x-ray image taken by a 15 μm thick front side illuminated CMOS minimal array with 8 μm pixels.
Figure 10:
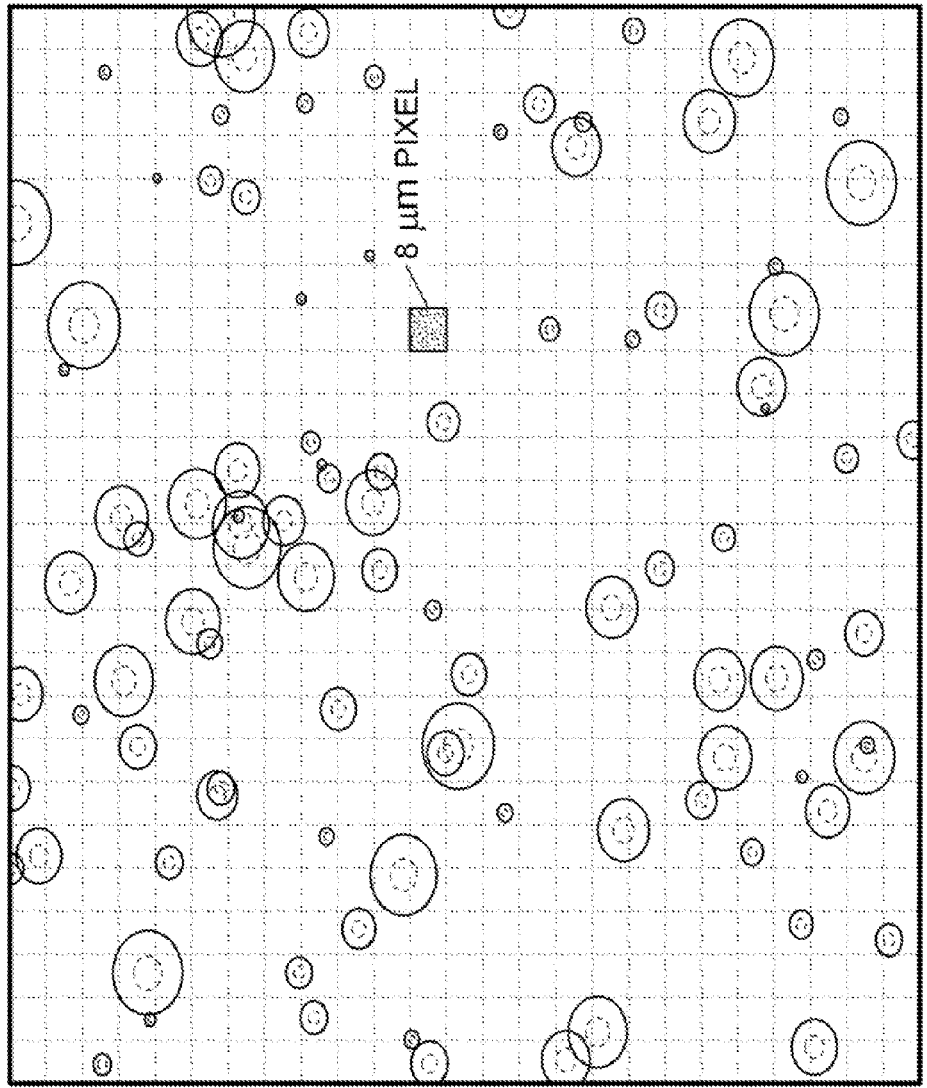
FIG. 10 shows a corresponding simulated Monte Carlo response for aforementioned CMOS imager array with and without substrate bias applied.
Figure 11:
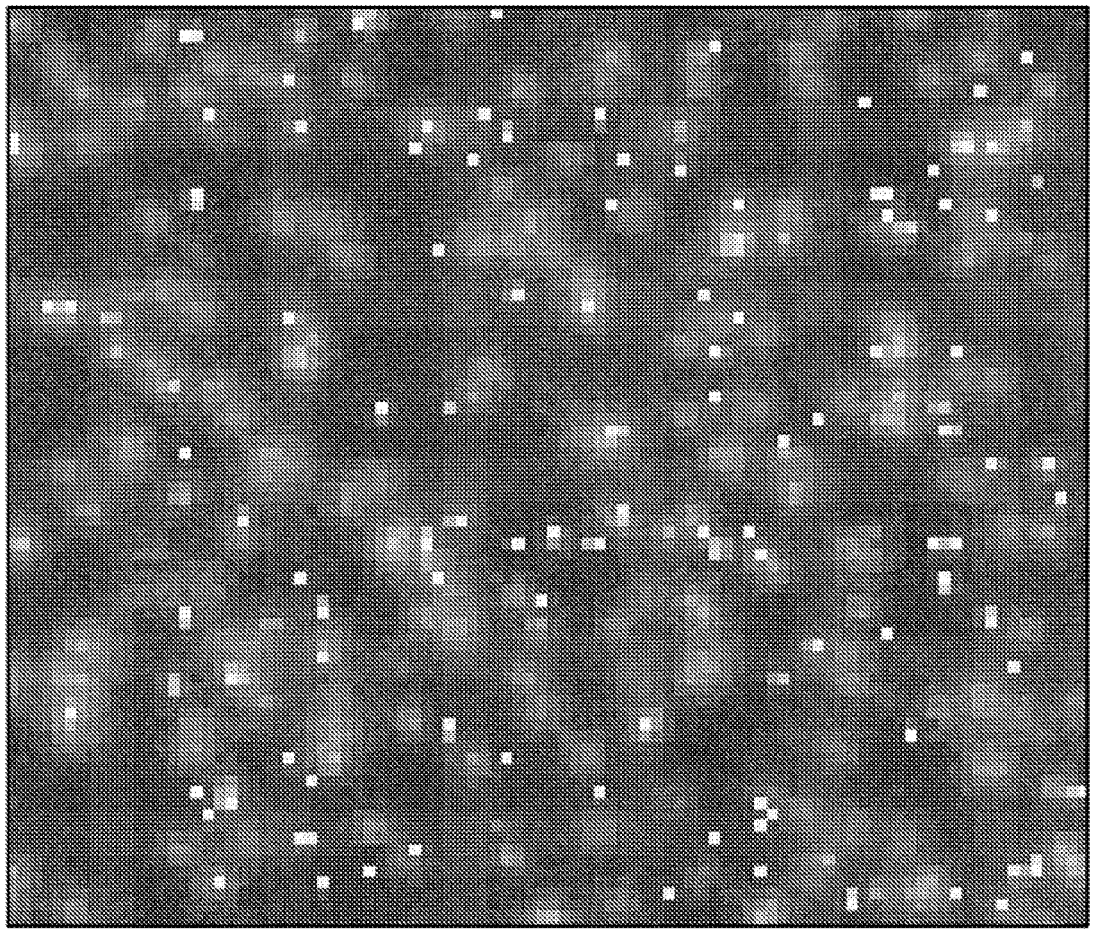
FIGS. 11 and 12 are similar results corresponding to FIGS. 9 and 10 for 25 μm epi silicon producing much greater charge diffusion clouds.
Figure 12:
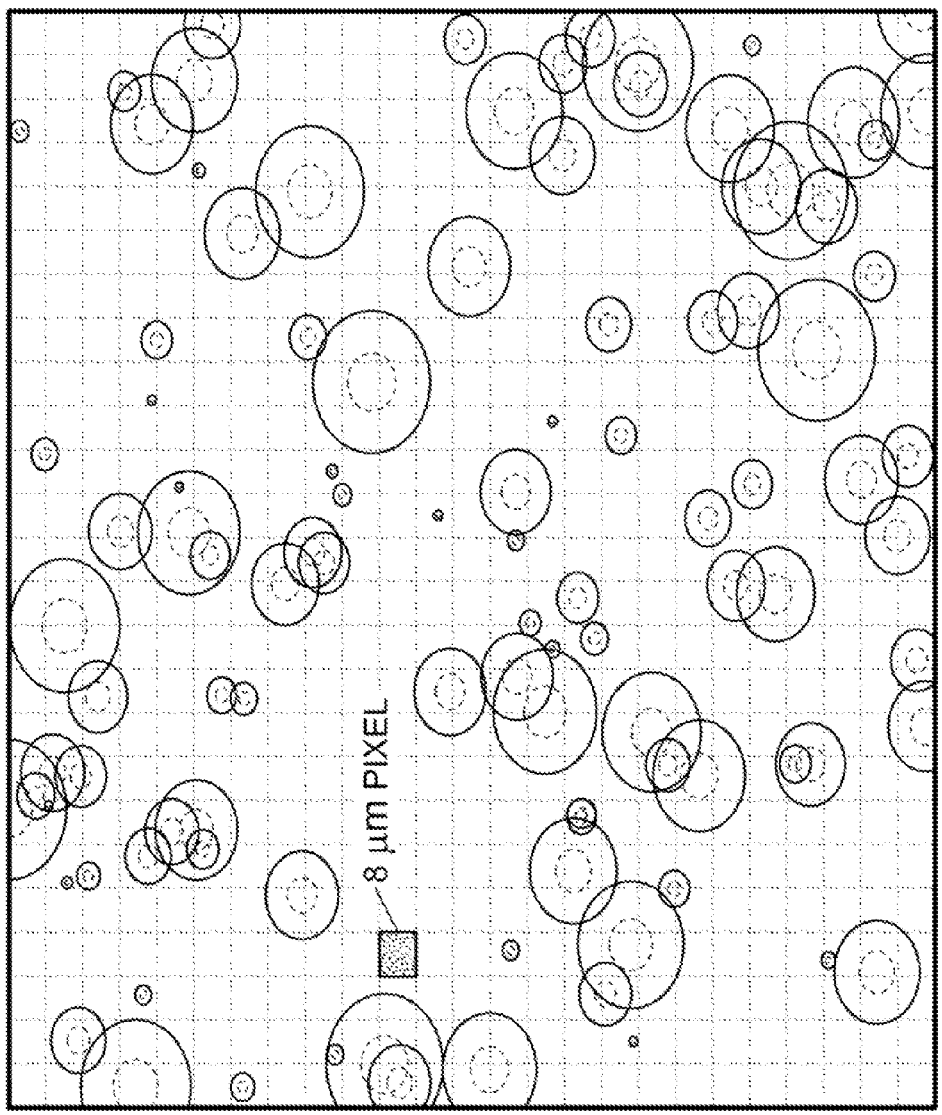

Fe-55 x-ray photons represent a nearly perfect point source stimulus that produces an initial 2σ cloud diameter of approximately 0.35 μm. FIG. 9 presents a Fe-55 x-ray image taken by a 15 μm thick front side illuminated CMOS minimal array (as described in J. Janesick, J. Cheng, J. Bishop, J. Andrews, J. Tower, J. Walker, M. Grygon, and T. Elliott, "CMOS minimal array", *Proc. SPIE* 6295, (2006)) with 8 μm pixels. As used herein, a minimal array is defined as a CMOS imager that is stripped of many commercial CMOS features leaving only pixels, row and column address decoders and switches, pixel clock drivers and clamping analog circuitry. FIG. 10 shows a corresponding simulated Monte Carlo response for aforementioned CMOS imager array with and without substrate bias applied. Note that the simulation plots assume $D_{MAX}$=8σ diffusion circles to contain all charge. The solid and dotted circles represent cloud sizes for $V_{SUB}$=0 V and −20 V respectively. Ideally, the image and the simulation should contain only x-ray events that only involve the target pixel, however because of diffusion, signal charge expands into neighboring pixels. Each x-ray event produces a different cloud size depending on where in the device the x-ray is absorbed. An x-ray absorbed at the immediate front surface creates a very small point-spread equal to the initial cloud generated by the x-ray photon. Those x-rays that interact near the epi-substrate interface exhibit the largest point-spreads (corresponding to $D_{MAX}$ labeled in the figure). For example, for 15 μm silicon $D_{MAX}$=15.2 μm for $V_{SUB}$=0 V and decreases to $D_{MAX}$=5.2 μm for $V_{SUB}$=−20 V. FIGS. 11 and 12 are similar results for 25 epi silicon producing much greater charge diffusion clouds. For 25 μm silicon substrate bias is essential for an 8 μm pixel imager to achieve good CCE performance.

Figure 13:
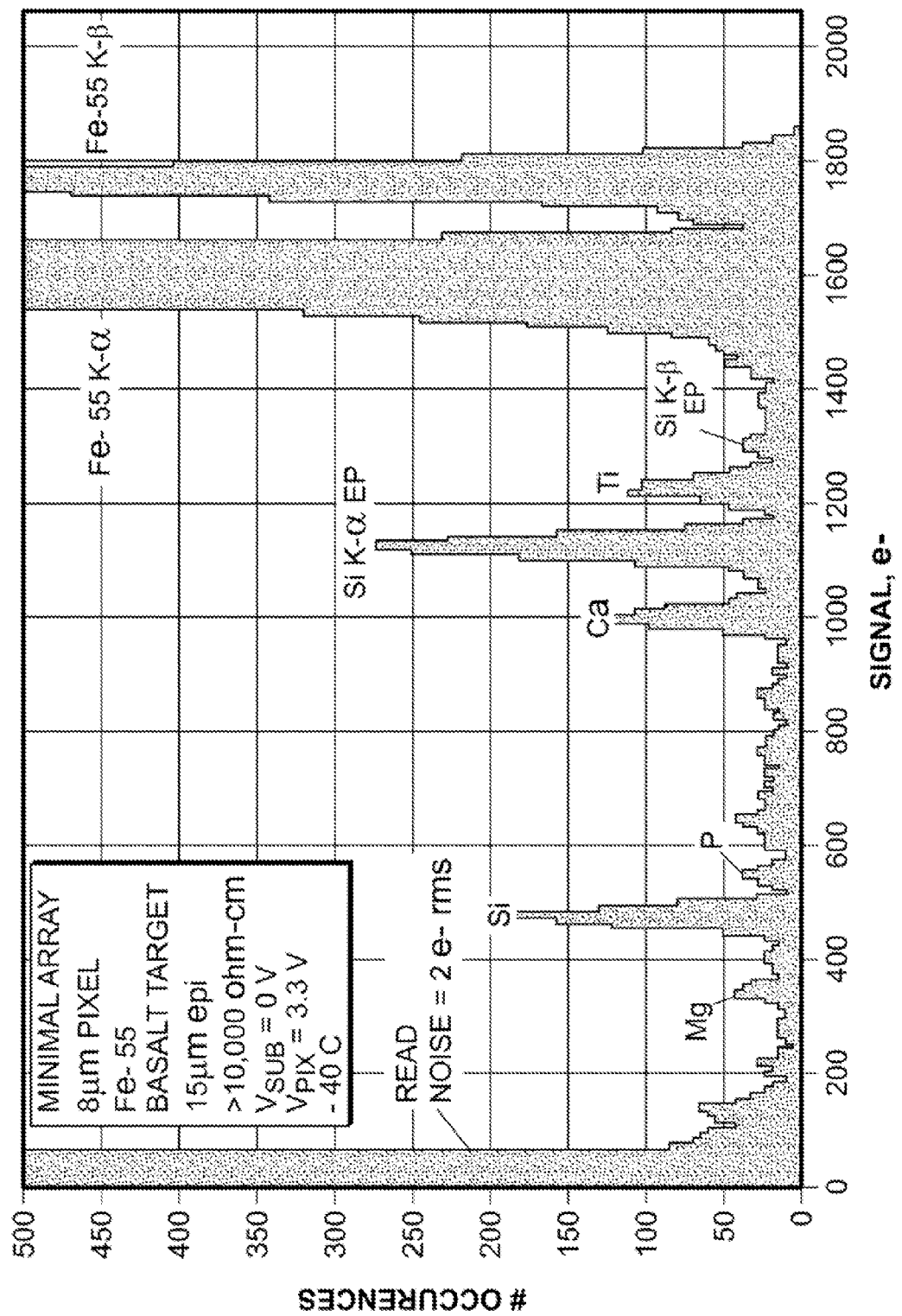
FIG. 13 presents a single event x-ray histogram taken from a 15 μm thick CMOS minimal array.
Figure 14:
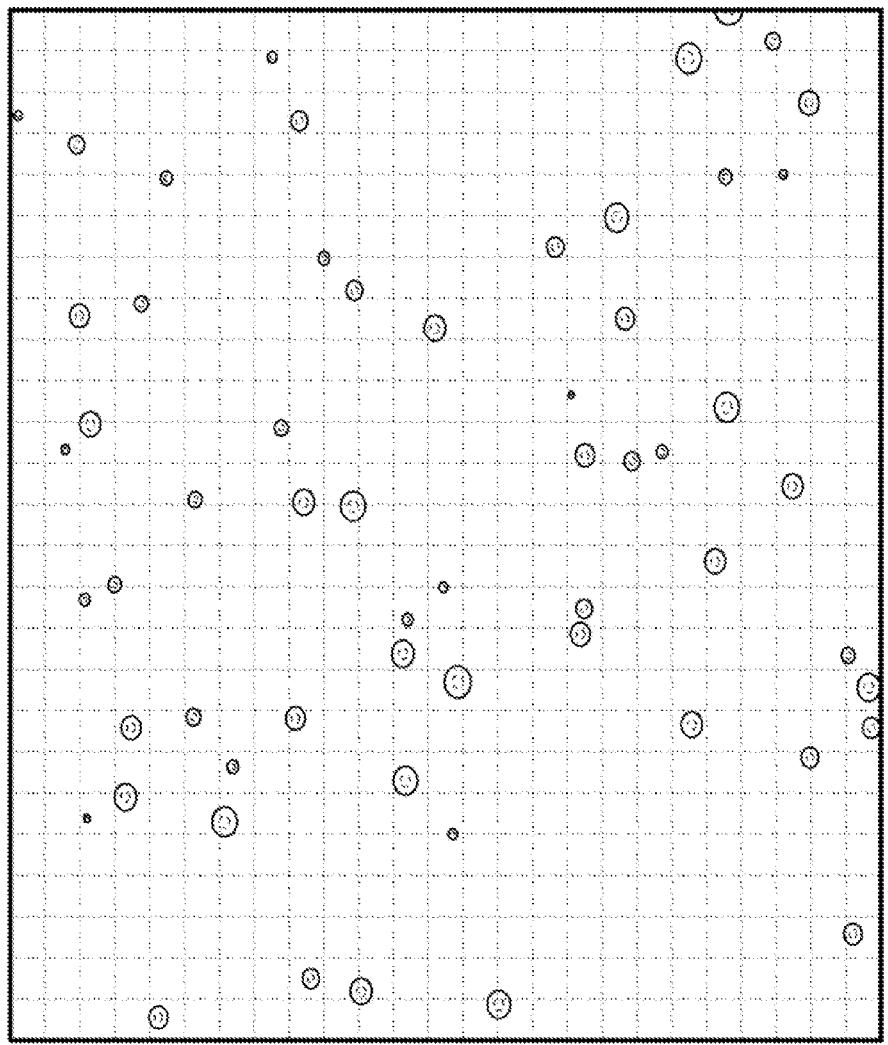
FIG. 14 presents simulated data for a fully depleted 5 μm sensor built on SOI epi.

Even with high resistivity silicon and substrate bias that x-ray split events may still be generated. To deal with split events, split events are either discarded keeping only single pixel events, or the pixels that make up a split event are summed and degraded energy resolution is tolerated (because of the read noise increase). For example, FIG. 13 presents a single event x-ray histogram taken from a 15 μm thick CMOS minimal array. Excellent energy resolution is achieved showing low level x-ray lines from a basalt target and Fe-55 source that would not be seen unless split events were discarded by a computer. For minimum charge splitting, very thin sensors are required. For example, FIG. 14 presents simulated data for a fully depleted 5 μm sensor built on SOI epi (refer to FIG. 18 discussions). With substrate bias applied, x-ray point-spread for most events is very close to the limit of the initial cloud diameter. Curiously, ultra thin (2 μm) very small pixel (<1.5 μm) commercial BSI imagers are limited by this diameter. However, no single pixel events are observed since the initial cloud diameter is always greater than the pixel size.

Figure 15B:
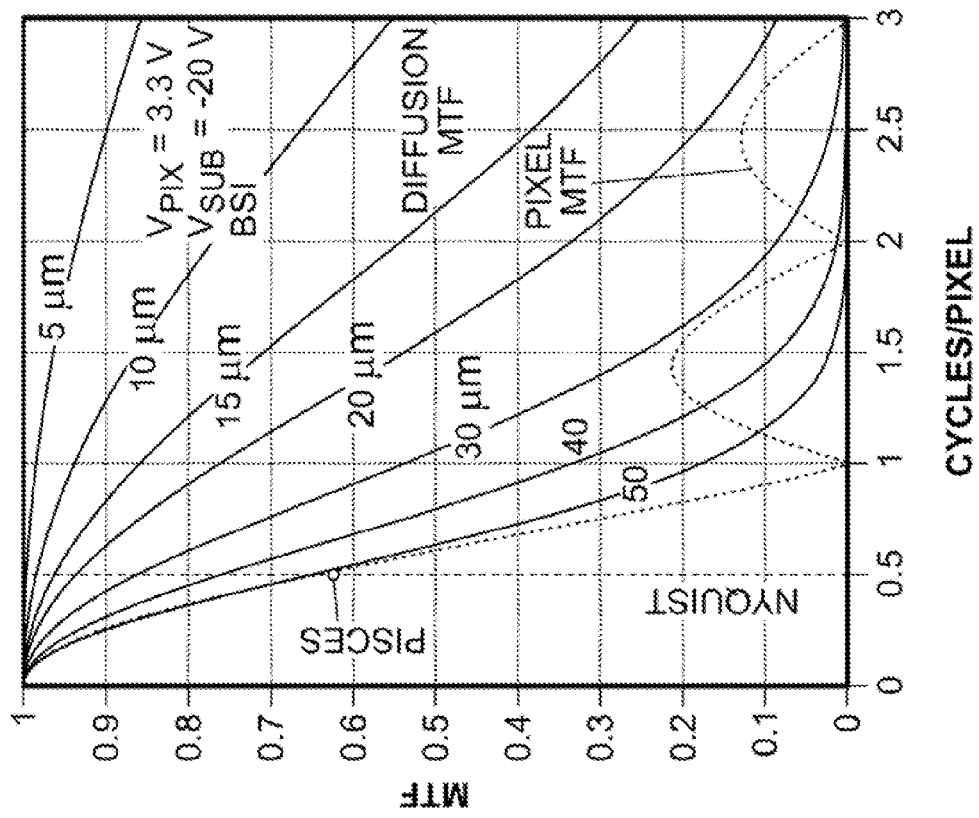
FIGS. 15A and 15B show modulation transfer function (MTF) versus epi thickness and substrate bias, respectively.
Figure 15A:
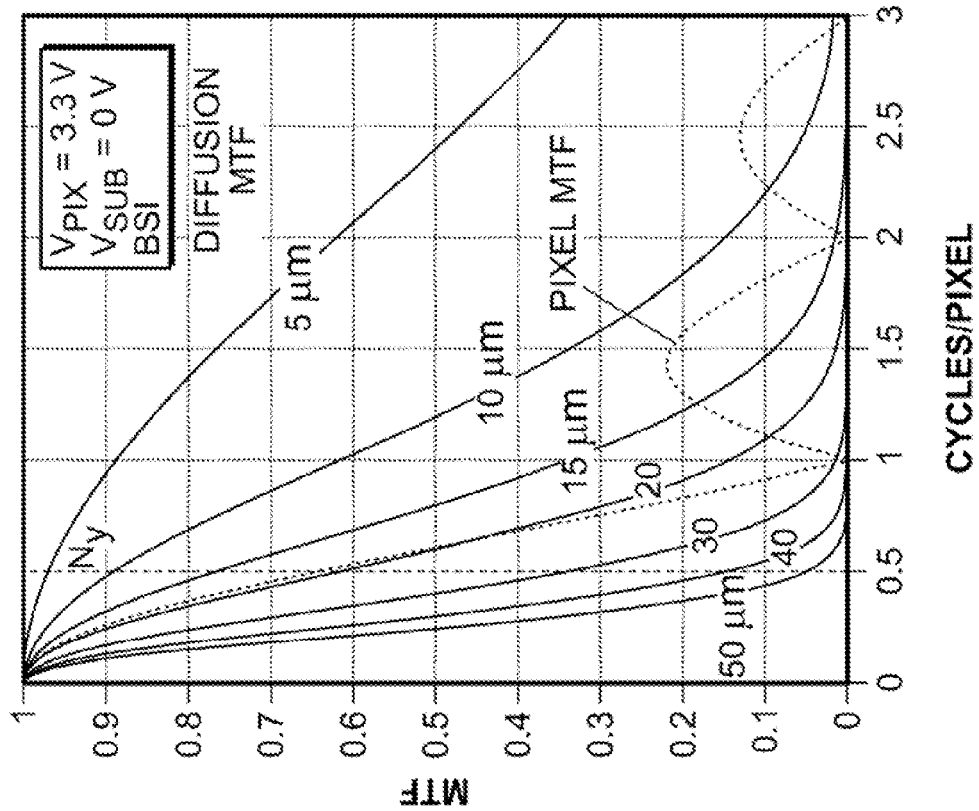

The substrate biasing method of the present invention is useful for both front side and back side illuminated imagers to reduce crosstalk and to improve modulation transfer function (MTF) performance. MTF is routinely used to specify CCE performance. Diffusion MTF may be evaluated by taking the Fast Fourier Transform (FFT) of the point-spread responses shown in FIG. 8A. Performing this operation produces the results shown in FIGS. 15A and 15B. Note that spatial frequency is given in units of cycles/pixel with Nyquist being at 0.5 cycles/pixel. Also shown is the pixel MTF response assuming a 100% fill factor. For example, for $V_{SUB}$=0 V plot (FIG. 15A), the diffusion and pixel MTF are 0.33 and 0.63 respectively for 30 μm thick silicon. The overall MTF is 0.20. The net MTF increases to 0.54 when a substrate bias of −20 V is applied (FIG. 15B). There is one data point produced by PISCES to check MTF results (50 μm silicon, $V_{PIX}$=3.3 V and $V_{SUB}$=0 V). PISCES may provide a sinusoidal stimulus at a desired optical wavelength to generate MTF directly. Agreement between equations and PISCES has been excellent.

MTF results in FIGS. 15A and 15B again show the difficulty for thick CMOS imagers to achieve high CCE. The problem is compounded by the reduction of photo diode voltage as signal charge collects. This issue is particularly critical for the n__5TPPD pixel which begin to operate with a potential that is approximately half the sense node voltage without charge (i.e., 1.5 V for 3.3 V processing). The PPD potential collapses with signal taking potential to near 0.5 V degrading CCE significantly. Therefore, substrate bias is important for scientific CMOS imagers.

The point-spread analysis presented above assumes that the p-type epitaxial layer 74 of FIG. 3 is fully depleted and produces a constant electric field throughout the p-type epitaxial layer 74. An imager fabricated with a high resistivity epitaxially grown substrate (epi) may achieve this condition and potentially deplete to 50 µm with 3.3 V. bias (refer to FIG. 16A). In contrast, commercial imagers that use 5-10 ohm-cm silicon cannot achieve such a depletion depth with substrate bias (<2 µm is typical). Consequently MTF performance for commercial imagers is relatively poor for use in x-ray and near IR applications).

Figures 16A, 16B:
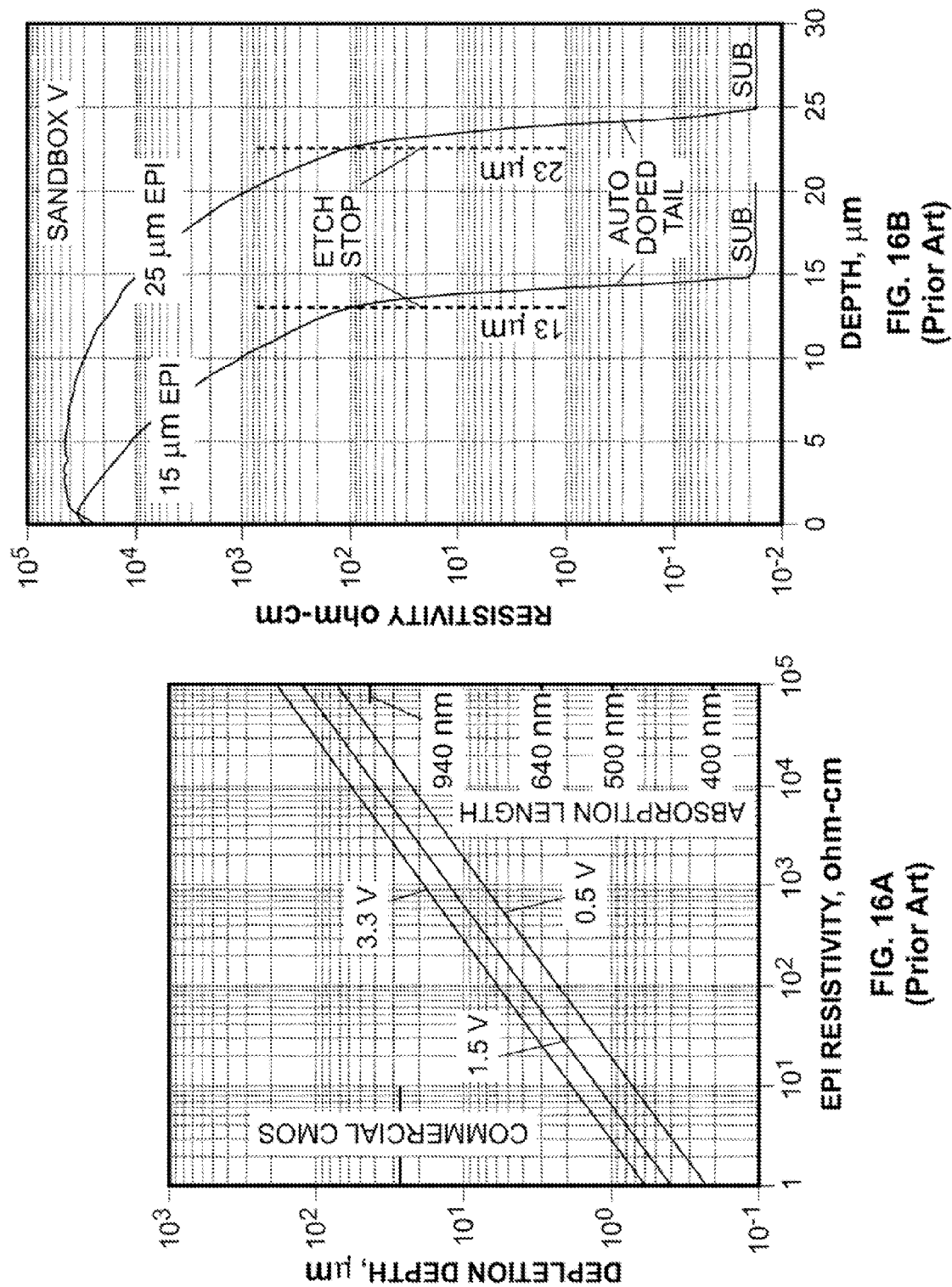
FIG. 16A shows depletion depth versus epi resistivity for the CMOS imager of FIG. 3.
FIG. 16B plots epi silicon resistivity as a function of depth for 15 and 25 μm custom silicon typically used to fabricate CMOS imagers in the prior art.
Figures 17A, 17B:
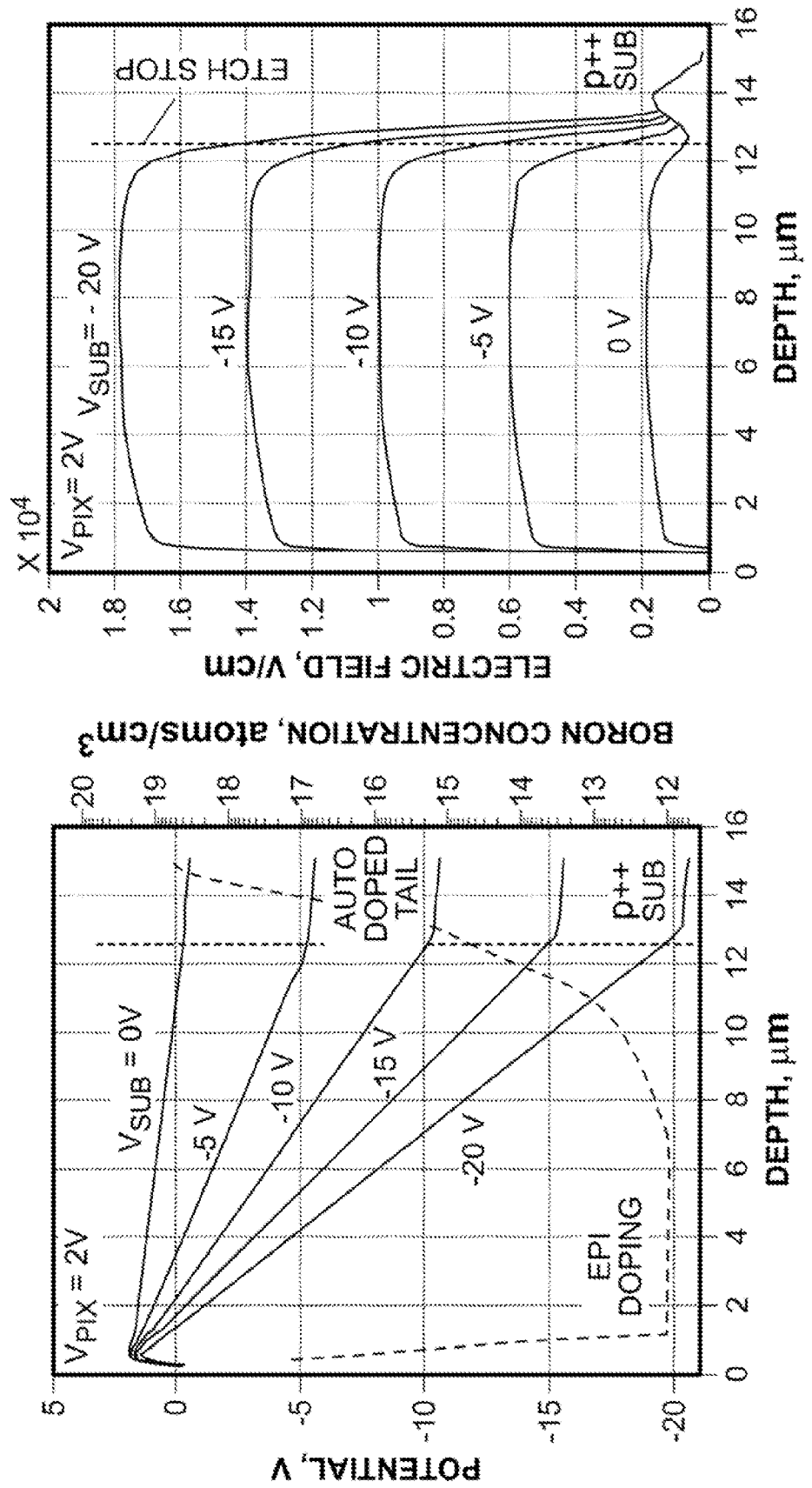
FIGS. 17A and 17B present potential plots for 14 µm epi showing potential, doping and electric field profiles as the substrate bias is varied in the prior art.

FIG. 16B plots epi silicon resistivity as a function of depth for 15 and 25 µm custom silicon typically used to fabricate CMOS imagers in the prior art. Note that the silicon exhibits a long epitaxial layer 'auto doped substrate tail' characteristic of epitaxial grown silicon. Full depletion for the epi layer may be achieved by removing some of the highly doped tail by thinning to the etch stops indicated (i.e., 13 and 23 µm respectively). FIGS. 17A and 17B present potential plots for 14 µm epi showing potential, doping and electric field profiles as the substrate bias is varied. For the epi layer silicon of FIGS. 17A and 17B, the etch stop required for full depletion and constant electric field is approximately 12 µm.

According to an embodiment of the present invention, the 'auto doped substrate tail' characteristic of epitaxial grown silicon may be eliminated by manufacturing a high resistivity imager employing silicon-on-insulator (SOI) technology. One version in the prior art of a back-illuminated imaging device that employs SOI technology is described in U.S. Pat. No. 7,238,583 (hereinafter "the '583 patent"). According to the '583 patent, the process of manufacturing a back-illuminated imager begins with a pre-manufactured SOI wafer comprising a mechanical substrate, a buried oxide (box) layer overlying the substrate which is highly doped, preferably with boron, and an undoped seed layer overlying the box layer. An epitaxial layer is grown overlying the seed layer at high temperature and imaging components are formed overlying the epitaxial layer. The high temperatures used during the epitaxial growth process causes the boron in the highly doped box layer to diffuse into the epitaxial layer to produce an imager with a built-in electric field which tends to drive electrons toward front side imaging components.

Figures 18A, 18B:
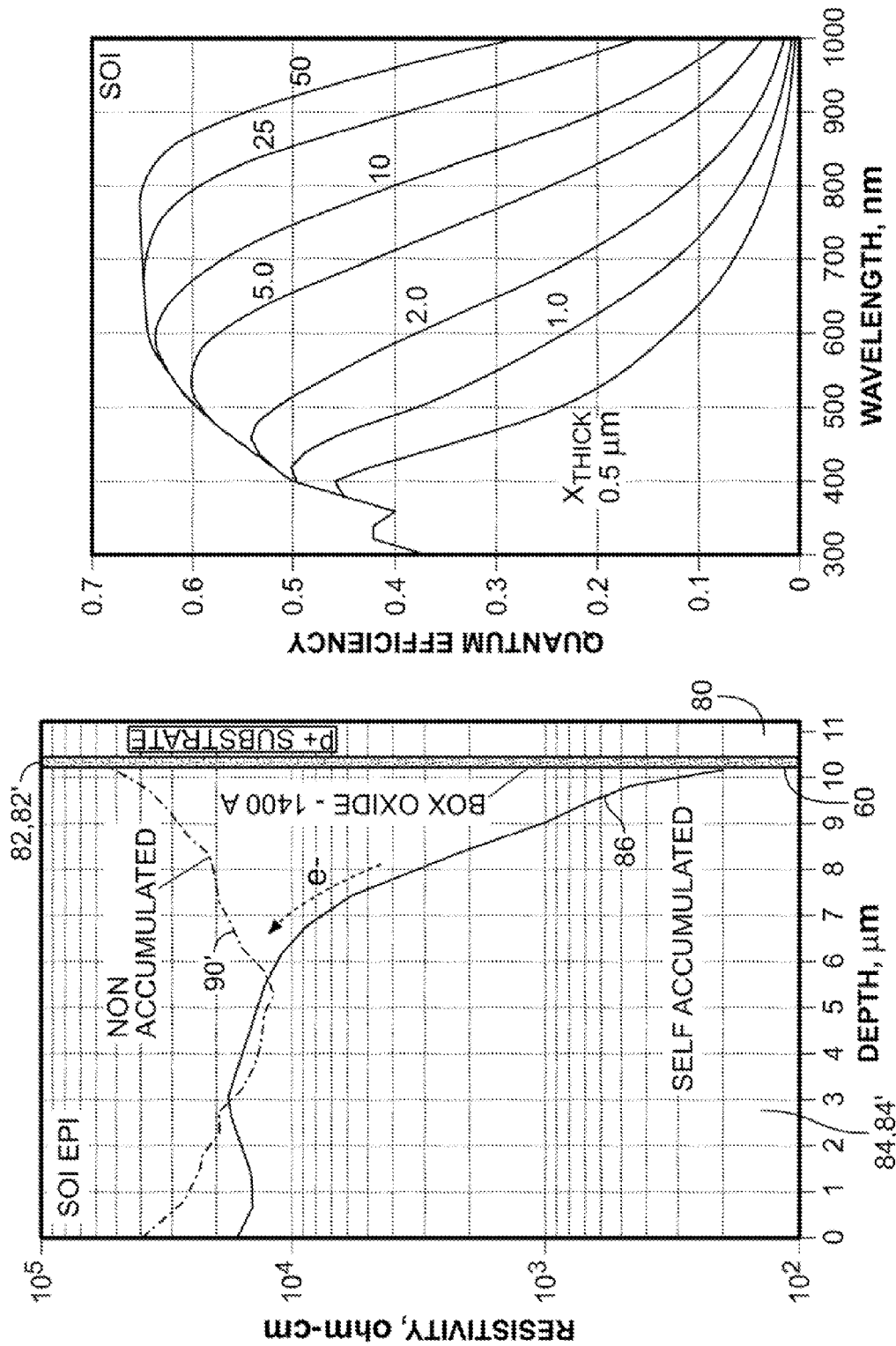
FIG. 18A depicts doping concentration versus thickness along an SOI wafer employed in both the '583 patent and a high resistivity CMOS imager based on the CMOS imager of FIG. 3, according to an embodiment of the present invention.
FIG. 18B is a plot of theoretical quantum efficiency with wavelength for a variety of epi thicknesses for the high resistivity CMOS imager of FIG. 18A.

FIG. 18A depicts doping concentration versus thickness along an SOI wafer employed in both the '583 patent and a high resistivity imager employing substrate biasing techniques, according to an embodiment of the present invention. The SOI wafer includes a mechanical substrate layer 80, a box layer 82 overlying the substrate layer 80, and an epi layer 84 overlying the box layer 82. For a device manufactured using the process described in the '583 patent, the box layer 82 is highly doped and though a process of high temperature epitaxial growth of the epi layer 84 followed by annealing, the dopant in the box layer 82 diffuses into the epi layer 84 to produce a doping profile 86 has a maximum at an interface 90 between the box layer 82 and the epi layer 84 which decreases montonically toward the front side of the imager. A device exhibiting the doping profile 86 as manufactured using the process described in the '583 patent is called a 'self accumulated' profile, which exhibits an artificially exaggerated doping tail. For visible imaging applications, the substrate 80 of the '583 patent is thinned to the box layer 82.

In contrast, an imager employing SOI technology according to an embodiment of the present invention uses a non-doped box layer 82' overlying a highly doped mechanical substrate (e.g., p+ type) and epi layer 84' which exhibits the non-accumulated profile 90' shown in FIG. 18A. In such circumstances, SOI is advantageous over conventional silicon because the 'box' oxide layer 82' shown acts as an etch stop that makes thinning easy and precise. Also, SOI does not have the troublesome auto doped tail mentioned above. Instead high resistivity silicon with greater than about 100 ohm-cm high resistivity epi may be maintained throughout the epi 84' to 'box' oxide layer 82'. Very thin imagers may be fabricated using SOI because the epi layer grown may be as thin as desired (refer to FIGS. 14 and 18B). Substrate bias may be applied to an imager employing SOI technology and having top side components (not shown) having the configuration shown in either FIG. 3 or 5 that are formed in the epi layer 84' of FIGS. 18A and 18B). In such an imager, substrate bias may be adjusted as SOI thickness changes to maintain full depletion.

Figure 19:
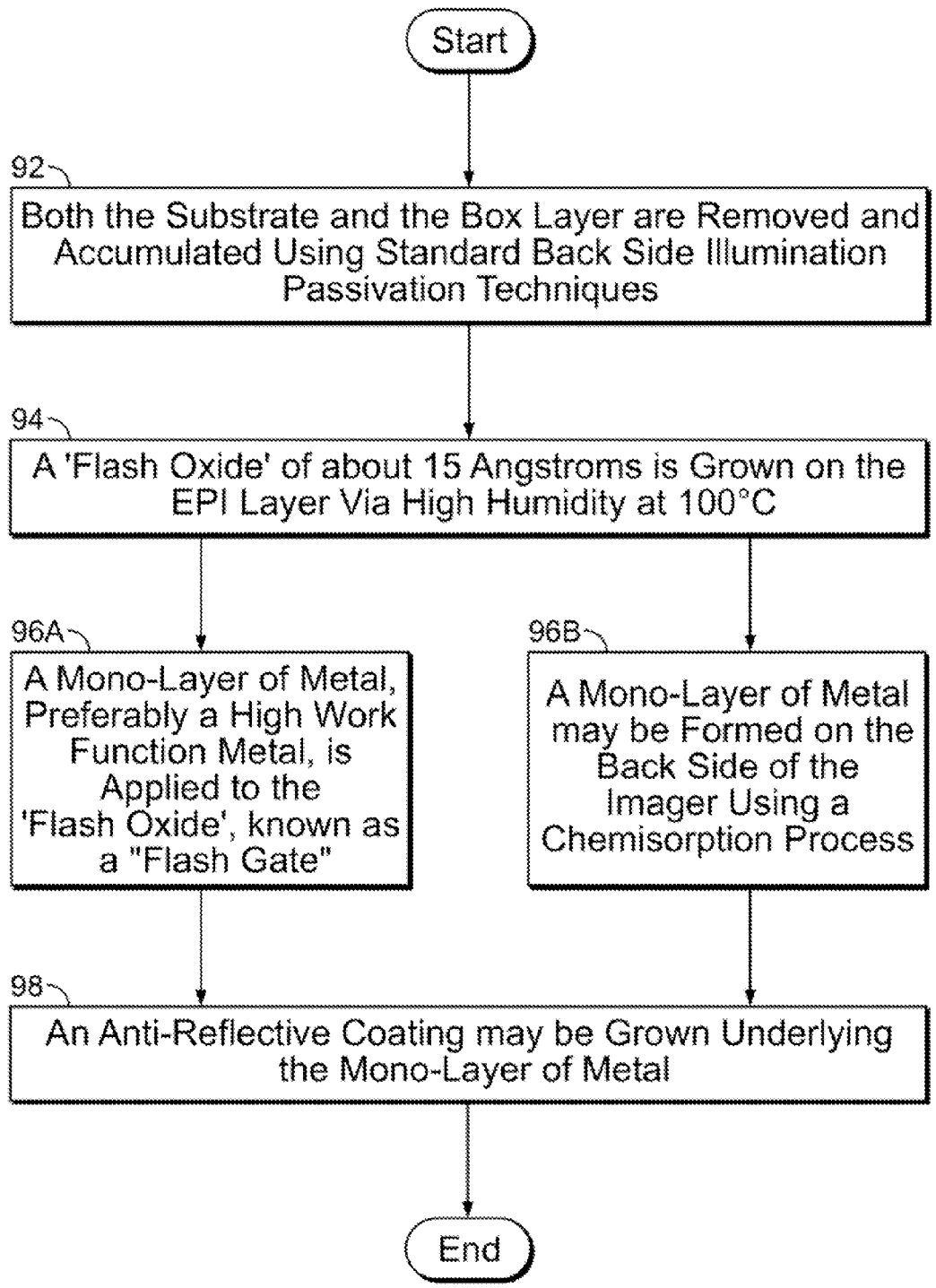
FIG. 19 is a process flow diagram illustrating exemplary steps for treating the back side of a CMOS imager employing SOI technology to produce the non-accumulated profile, according to an embodiment of the present invention.

FIG. 19 is a process flow diagram illustrating exemplary steps for treating the back side of a CMOS imager employing SOI technology to produce the non-accumulated profile 90', according to an embodiment of the present invention. At step 92, both the substrate 80' and the box layer 82' are removed using standard back side illumination passivation techniques. At step 94, a 'flash oxide' of about 15 angstroms (i.e., an ultrathin oxide layer) is grown on the epi layer 84' via high humidity at 100 C (Flash oxide is equal to a mature native oxide after several years of growth.) According to an embodiment of the present invention, at optional step 96A, a monolayer of metal, preferably a high work function metal, is applied to the 'flash oxide', known as a "flash gate." According to still another embodiment of the present invention, at step 96B, a mono-layer of metal may be formed on the 'flash oxide' using a chemisorption process. ork function metal attracts electrons. Electrons in turn attract holes from the (preferably, but not limited to, boron doped) epi layer 84'. The holes 'accumulate' at the back surface. The hole gradient formed generates an electric field that pushes signal electrons away from the back side. At optional step 98, an anti-reflective coating may be grown underlying the mono-layer of metal.

CMOS imagers manufactured using chemisorption may have a high quantum efficiency typically in the range of about 90%. FIG. 18B plots theoretical quantum efficiency with wavelength for a variety of epi thicknesses (without anti reflection coatings applied). Note that the UV QE is not dependent on thickness as visible and near IR wavelengths are. This characteristic is attractive for semi 'IR blind' imagers. Ultra thin detectors are also required by commercial back side illuminated imagers with very small pixels.

Although certain embodiments of the present invention pertaining to back-illuminated imagers have employed backside treatments that include "flash gate", chemisorption, and accumulated ultra-thin silicon-on-insulator (UTSOI), backside treatments of the present invention may also employ ion implantation with laser annealing, unaccumulated UTSOI, etc.

Figure 20:
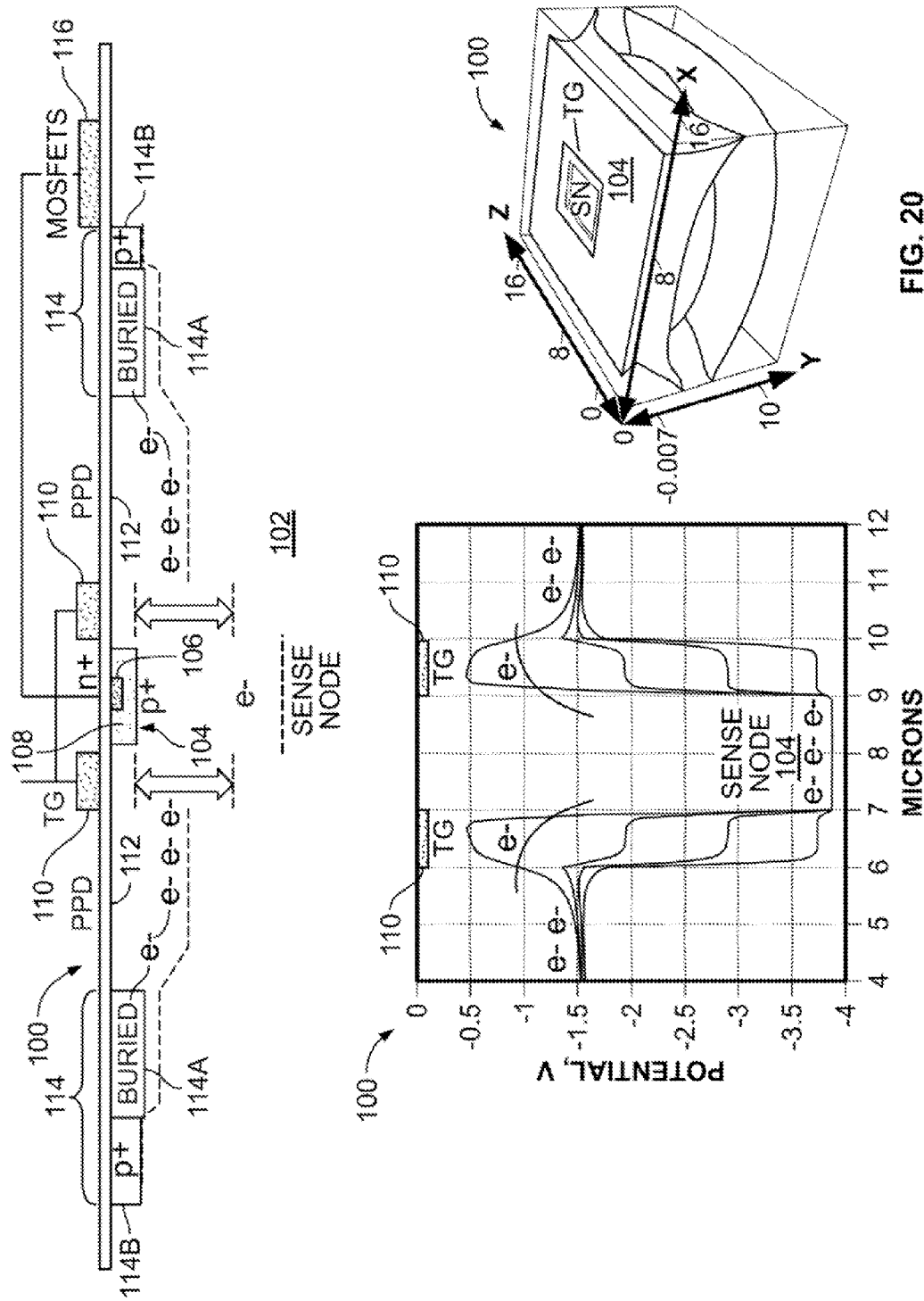
FIG. 20 depicts a side view of a 5TPPD ring pixel, according to an embodiment of the present invention.
Figure 21:
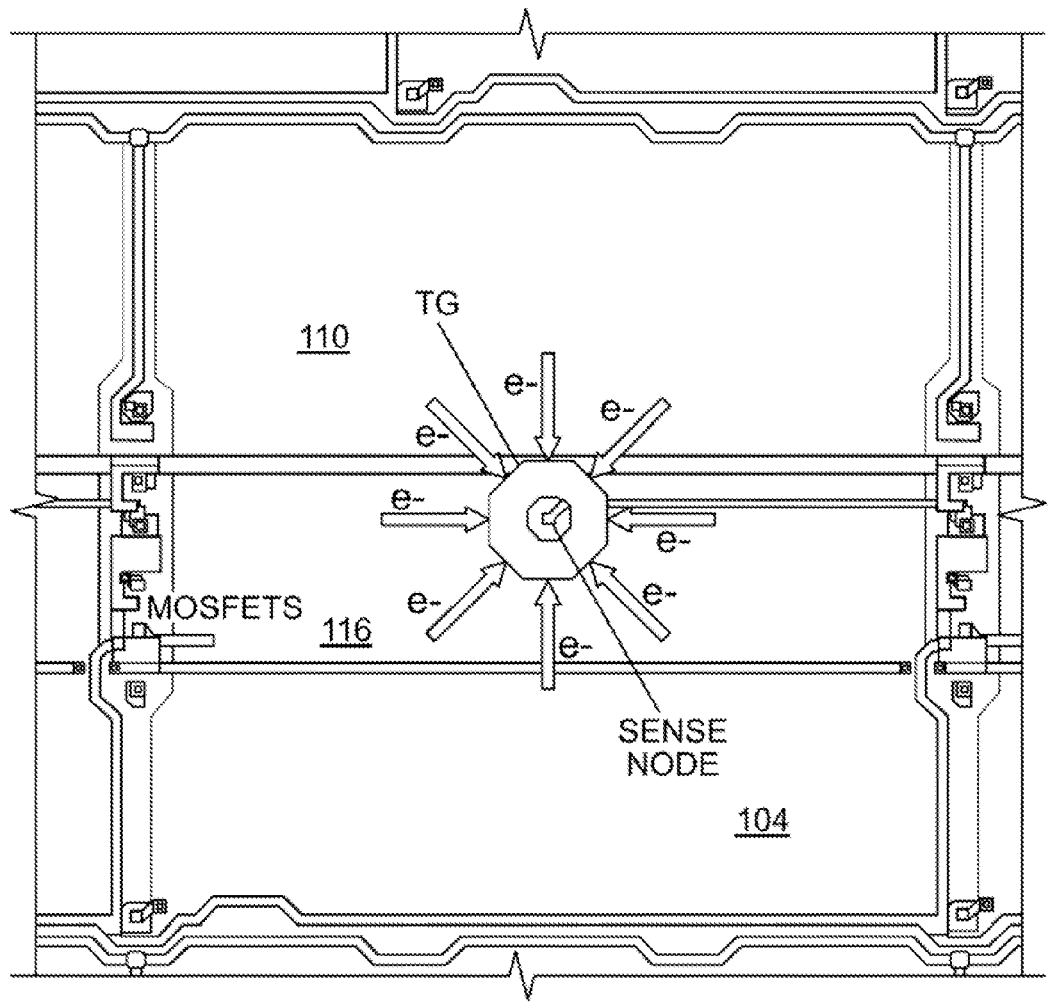
FIG. 21 depicts a top-down view of the ring pixel of FIG. 20, according to an embodiment of the present invention.

FIG. 20 depicts a side view of a n__5TPPD ring pixel 100, while FIG. 21 depicts a top-down view of the ring pixel 100, according to an embodiment of the present invention. The ring pixel 100 may be implemented with high resistivity semiconductor substrate 102 and substrate bias depletion. The ring pixel 100 includes a sense node 104 formed in the semiconductor substrate 102 substantially in the center of the ring pixel 100. The sense node 104 comprises a highly doped n+ region 106 formed in a highly doped p+ region 108 (hereinafter the p-well 108). A ring shaped transfer gate 110 is formed about the sense node 104. A ring shaped pinned photo diode (PPD) 102, is formed about the ring shaped transfer gate 110. An optional ring shaped implant 114 comprising a buried channel 114A and a p+ region 114B may be formed about the ring shaped PPD 112 for generating a small 'potential step' to help charge move towards the ring shaped transfer gate 110. The optional ring shaped implant 114 may be used for very large pixels that need this assistance. Read MOSFETS 116 abut one side of the p+ regions 114B. Referring now to FIG. 21, the ring-based architecture of the ring pixel 100 is configured so that charge (in this case electrons) is transferred from all directions originating from the ring shaped PPD 112 through the ring shaped transfer gate 110 to the central sense node 104 (indicated by the arrows 118), thereby reducing charge transfer time.

The ring pixel 100 may be substituted for the n_pixels 54 of FIG. 3 to form an n_imager. (Likewise, a ring pixel having inverted polarities and biasing voltages may be substituted for the p_pixel of FIG. 5 to for a p_imager). The ring pixel 100 is connected to substrate bias through a substrate bias contact (not shown), which is >100 μm from the pixels. The substrate bias is its own return, since it references the entire substrate of the chip. Normally it is at ground (0 V) just like the p-well in which the 3 read MOSFETs are located. Certain embodiments of the present invention allow it to assume a different potential.

However, unlike sense node regions (not shown) associated with the n_pixels 54 depicted in FIG. 3, which have p+ return contacts 36, the sense node 104 of the ring pixel 100 is not grounded, but floating. However, the read MOSFETs 116 to the side of the ring pixel 100 still need to be located in a grounded p-well and may influence, just as for FIG. 3, how much substrate bias may be applied. The combination of the floating sense node 104 and the grounded p-well of the MOSFETs 116 permits the p-well 108 to have a minimum width comparable to that employed in n_3TPPD pixels. As a result, more substrate bias may be applied. Conventional CMOS pixel designs require a larger p-well width because the sense node and transfer gate are part of the same p-well that the MOSFETs share.

Figure 22:
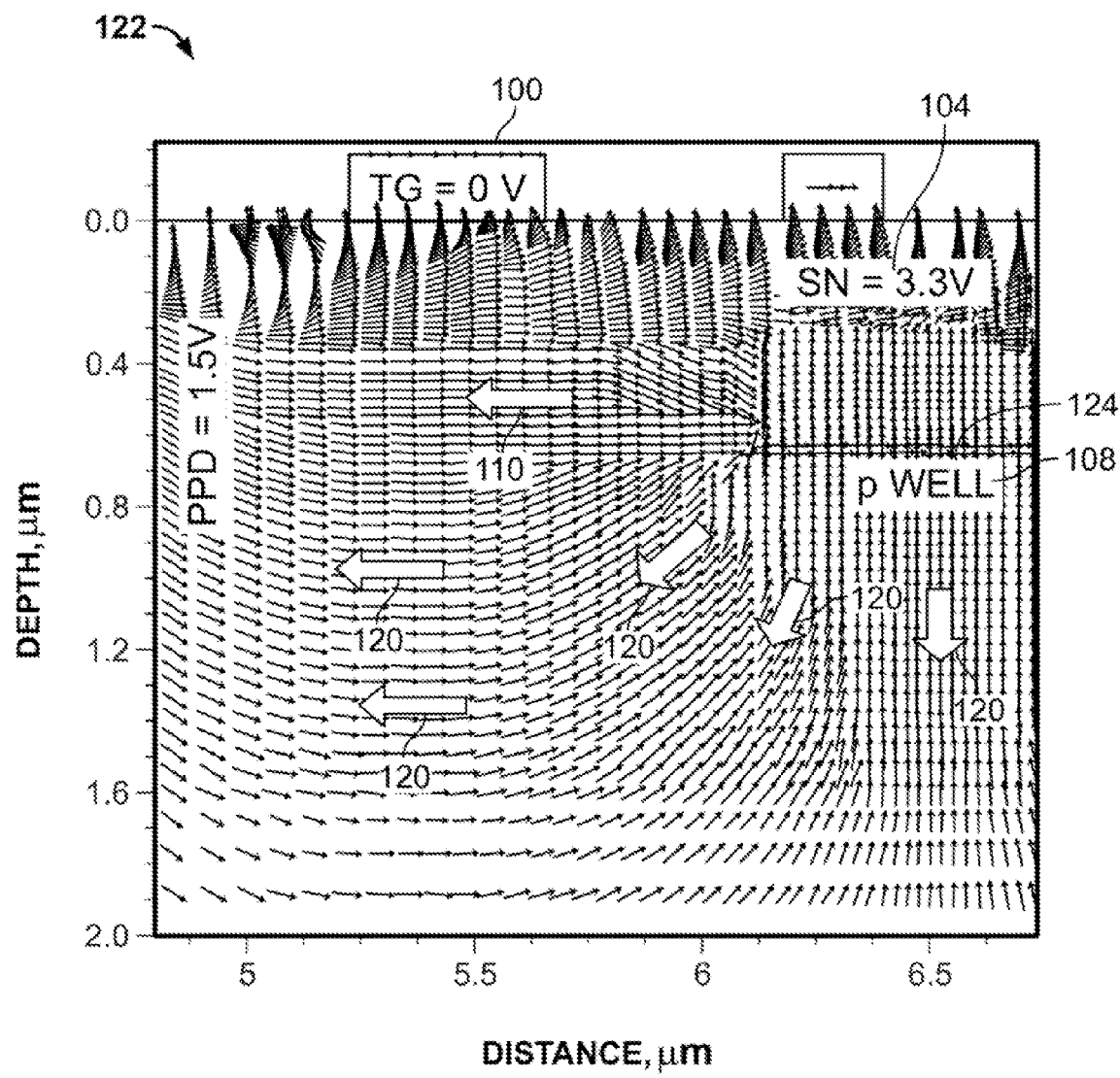
FIG. 22 displays the results of a PISCES simulation showing how a floating sense node naturally repels signal carriers, according to an embodiment of the present invention.
Figure 23:
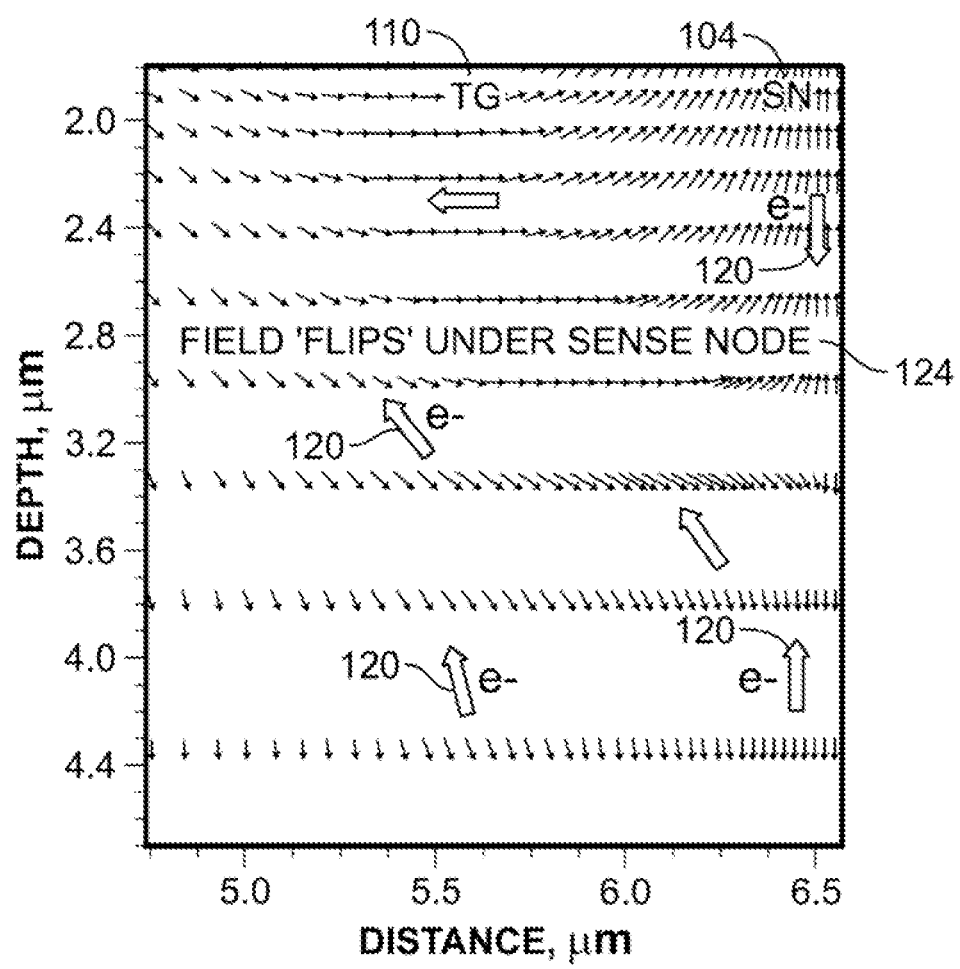
FIG. 23 is a magnified view of FIG. 22.

FIGS. 22 and 23 display the results of a PISCES simulation showing how the floating sense node 104 naturally repels signal carriers (indicated by the arrows 120) to the PPD 112, which permits the application of additional substrate bias. The signal carriers 120 (in this case electrons, e−) generated deep in the substrate 102 diffuse away from the sense node 104 into the PPD 112. Note that the carriers 120 are initially attracted toward the sense node 104 but are reflected away when they come within about 3 μm of a front side surface 122 of the ring pixel 100. At that distance, the electric fields change polarity at an interface 124 of the p-well 108, thus forcing the signal carrier 120 to the region of the PPD 112.

Referring again to FIGS. 20 and 21, to generate fringing fields at the very edges of the PPD 112, the implant 114 is employed, which 'steps' potential in the direction of the sense node 104 to further decrease transfer time. The ring pixel 100 may deliver high speed performance for 5TPPD pixels greater than 24 μm in thickness.

Although certain embodiments of the present invention refer to designs employing substrate bias using UTSOI technology with the bulk imager 50 of FIG. 3 or to a ring pixel 100 of FIG. 20 separately, other embodiments of the present invention (not shown) may combine ring pixels overlying a substrate whose backside treatment includes UTSOI with or without the application of substrate bias.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A method for forming a CMOS image sensor, comprising:
providing a lightly doped semiconductor substrate of a first conductivity type;
forming at least one CMOS pixel of a second conductivity type formed substantially in the semiconductor substrate;
applying a bias voltage to the semiconductor substrate for substantially depleting the semiconductor substrate for forming a depletion edge substantially within the semiconductor substrate;
forming driver logic in the semiconductor substrate; and
forming at least one well of the first conductivity type adjacent to and substantially underlying the driver logic operable to receive a bias for the driver logic.

2. The method of claim 1, wherein the at least one CMOS pixel further comprises:
a highly doped sense node of the second conductivity type;
a reset transistor of the second conductivity type in signal communication with the sense node;
a source follower transistor of the second conductivity type in signal communication with the sense node;
a row select transistor of the second conductivity type in signal communication with the source follower transistor; and
a highly doped return contact of the first conductivity type configured to receive a return potential for providing a return reference for the reset transistor, the source follower transistor, and the row select transistor.

3. The method of claim 2, further comprising forming a well of the second conductivity type substantially surrounding the at least one CMOS pixel to form a depletion region about the at least one CMOS pixel operable to form a minimum predetermined barrier to the depletion edge within the semiconductor substrate to pinch off substrate bias in proximity to the return contact.

4. The method of claim 3, wherein the minimum predetermined barrier voltage has a magnitude of at least 10kT, wherein k is the Boltzmann constant and T is temperature in degrees Kelvin.

5. The method of claim 1, wherein forming the at least one CMOS pixel further comprises the steps of:
forming a highly doped sense node of the second conductivity type in the semiconductor substrate and positioned substantially in the center of the at least one CMOS pixel;
forming a transfer gate about the sense node; and
forming at least one photodiode about the transfer gate.

6. The method of claim 1, wherein providing a substantially high resistivity semiconductor substrate further comprises:
providing a silicon-on-insulator substrate including a mechanical substrate, an insulator layer substantially overlying the mechanical substrate, and a semiconductor seed layer substantially overlying the insulator layer;
epitaxially growing the semiconductor substrate substantially overlying the seed layer; and removing the mechanical substrate and at least a portion of the insulator layer.

7. The method of claim 6, further comprising forming an ultrathin oxide layer substantially underlying the semiconductor substrate and forming a mono layer of metal substantially underlying the ultrathin oxide layer.

8. The method of claim 7, wherein the ultrathin oxide layer is formed by a chemisorption process.

9. A method for forming a CMOS image sensor, comprising:
providing a lightly doped semiconductor substrate of a first conductivity type;
forming at least one CMOS pixel of a second conductivity type formed substantially in the semiconductor substrate, wherein the at least one CMOS pixel comprises:
a highly doped sense node of the second conductivity type;
a reset transistor of the second conductivity type in signal communication with the sense node;
a source follower transistor of the second conductivity type in signal communication with the sense node;
a row select transistor of the second conductivity type in signal communication with the source follower transistor; and
a highly doped return contact of the first conductivity type configured to receive a return potential for providing a return reference for the reset transistor, the source follower transistor, and the row select transistor;
forming a well of the second conductivity type substantially surrounding the at least one CMOS pixel to form a depletion region about the at least one CMOS pixel operable to form a minimum predetermined barrier to the depletion edge within the semiconductor substrate to pinch off substrate bias in proximity to the return contact; and
applying a bias voltage to the semiconductor substrate for substantially depleting the semiconductor substrate for forming a depletion edge substantially within the semiconductor substrate.

10. The method of claim 9, wherein the minimum predetermined barrier voltage has a magnitude of at least 10kT, wherein k is the Boltzmann constant and T is temperature in degrees Kelvin.

11. The method of claim 9, further comprising forming driver logic in the semiconductor substrate.

12. The method of claim 11, further comprising forming at least one well of the first conductivity type adjacent to and substantially underlying the driver logic operable to receive a bias for the driver logic.

13. The method of claim 9, wherein forming the at least one CMOS pixel further comprises:
forming the highly doped sense node of the second conductivity type in the semiconductor substrate and positioned substantially in the center of the at least one CMOS pixel;
forming the transfer gate about the sense node; and
forming at least one photodiode about the transfer gate.

14. The method of claim 9, wherein providing a substantially high resistivity semiconductor substrate further comprises:
providing a silicon-on-insulator substrate including a mechanical substrate, an insulator layer substantially overlying the mechanical substrate, and a semiconductor seed layer substantially overlying the insulator layer;
epitaxially growing the semiconductor substrate substantially overlying the seed layer; and
removing the mechanical substrate and at least a portion of the insulator layer.

15. The method of claim 14, further comprising forming an ultrathin oxide layer substantially underlying the semiconductor substrate and forming a mono layer of metal substantially underlying the ultrathin oxide layer.

16. The method of claim 15, wherein the ultrathin oxide layer is formed by a chemisorption process.

* * * * *